(12) United States Patent
Chikagawa

(10) Patent No.: US 10,680,153 B2
(45) Date of Patent: Jun. 9, 2020

(54) THERMOELECTRIC CONVERSION ELEMENT AND METHOD FOR MANUFACTURING THERMOELECTRIC CONVERSION ELEMENT

(71) Applicant: Murata Manufacturing Co., Ltd., Nagaokakyo-shi, Kyoto-fu (JP)

(72) Inventor: Osamu Chikagawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/111,410

(22) Filed: Aug. 24, 2018

(65) Prior Publication Data

US 2019/0044043 A1    Feb. 7, 2019

Related U.S. Application Data

(63) Continuation of application No. PCT/JP2017/001562, filed on Jan. 18, 2017.

(30) Foreign Application Priority Data

Mar. 31, 2016 (JP) .................. 2016-071847

(51) Int. Cl.
*H01L 35/32* (2006.01)
*H01L 35/22* (2006.01)
*H01L 35/34* (2006.01)

(52) U.S. Cl.
CPC .............. *H01L 35/32* (2013.01); *H01L 35/22* (2013.01); *H01L 35/34* (2013.01)

(58) Field of Classification Search
CPC .......... H01L 35/32; H01L 35/22; H01L 35/34
See application file for complete search history.

(56) References Cited

U.S. PATENT DOCUMENTS 8,222,510 B2 * 7/2012 Majumdar ............ H01L 35/22
                                                            136/201
9,299,907 B2   3/2016 Fan et al.
(Continued)

FOREIGN PATENT DOCUMENTS

JP     H11121815 A     4/1999
JP     2003282970 A    10/2003
(Continued)

OTHER PUBLICATIONS

Written Opinion of the International Searching Authority issued for PCT/JP2017/001562, dated Mar. 28, 2017.
(Continued)

*Primary Examiner* — Jayne L Mershon
(74) *Attorney, Agent, or Firm* — Arent Fox LLP

(57) ABSTRACT

A thermoelectric conversion element includes a laminated body including a plurality of first thermoelectric conversion parts, a plurality of second thermoelectric conversion parts, and an insulator layer. The first thermoelectric conversion parts and the second thermoelectric conversion parts are alternately arranged in the Y axis direction and the first thermoelectric conversion part and the second thermoelectric conversion part are joined in a region of the surface between the first thermoelectric conversion part and the second thermoelectric conversion part in the Y axis direction, and in the other region of the surface in the Y axis direction, the insulator layer is interposed between the first thermoelectric conversion part and the second thermoelectric conversion part. The laminated body has a first principal surface and a second principal surface at both ends in the Y axis direction, and both end surfaces in a direction perpendicular to the Y axis direction. The insulator layer covers the end surface of the second thermoelectric conversion part.

13 Claims, 13 Drawing Sheets

(56) References Cited

U.S. PATENT DOCUMENTS

| | | | |
|---|---|---|---|
| 2010/0116308 A1* | 5/2010 | Hayashi | H01L 35/22 136/236.1 |
| 2011/0197942 A1 | 8/2011 | Fan et al. | |
| 2012/0103379 A1* | 5/2012 | Krinn | H01L 35/32 136/212 |
| 2015/0325769 A1* | 11/2015 | Hayashi | H01L 35/32 320/101 |
| 2016/0155924 A1 | 6/2016 | Nakamura et al. | |
| 2016/0172569 A1* | 6/2016 | Fujimoto | H01L 35/16 136/238 |

FOREIGN PATENT DOCUMENTS

| | | |
|---|---|---|
| JP | 2009124030 A | 6/2009 |
| JP | 2009246296 A | 10/2009 |
| JP | 2012516030 A | 7/2012 |
| JP | 2013131692 A | 7/2013 |
| JP | 20155595 A | 1/2015 |
| JP | 20155596 A | 1/2015 |
| JP | 201579796 A | 4/2015 |
| WO | 2015019811 A1 | 2/2015 |

OTHER PUBLICATIONS

International Search Report issued for PCT/JP2017/001562, dated Mar. 28, 2017.

* cited by examiner

THERMOELECTRIC CONVERSION ELEMENT AND METHOD FOR MANUFACTURING THERMOELECTRIC CONVERSION ELEMENT

CROSS REFERENCE TO RELATED APPLICATIONS

The present application is a continuation of International application No. PCT/JP2017/001562, filed Jan. 18, 2017, which claims priority to Japanese Patent Application No. 2016-071847, filed Mar. 31, 2016, the entire contents of each of which are incorporated herein by reference.

TECHNICAL FIELD

The present invention relates to a thermoelectric conversion element and a method for manufacturing a thermoelectric conversion element.

BACKGROUND ART

Thermoelectric conversion elements have been proposed where a plurality of N-type thermoelectric conversion parts and a plurality of P-type thermoelectric conversion parts are arranged alternately (see, for example, Japanese Patent Application Laid-Open No. 11-121815). This thermoelectric conversion element has a structure where each thermoelectric conversion part is partially exposed at the outer surface of the thermoelectric conversion element. In addition, examples of this type of thermoelectric conversion element include, for example, an element where an N-type thermoelectric conversion part is formed from an N-type oxide semiconductor material including an oxide, whereas a P-type thermoelectric conversion part is formed from a P-type semiconductor material including a metal.

However, when the previously described thermoelectric conversion element is used in an atmosphere in which a corrosive gas such as hydrogen sulfide is dispersed, a portion of the P-type thermoelectric conversion part exposed at the outer surface of the thermoelectric conversion element will be exposed to the corrosive gas. As a result, the metal included in the P-type thermoelectric conversion part will react with the corrosive gas, thereby forming impurities including the corrosive gas component in the portion of the P-type thermoelectric conversion part exposed at the outer surface of the thermoelectric conversion element. Because of this, the movement of carriers in the P-type thermoelectric conversion part is inhibited, thereby decreasing the output voltage of the thermoelectric conversion element.

The present invention has been made in view of the foregoing, and an object of the invention is to provide a thermoelectric conversion element capable of suppressing degradation of electrical characteristics in the thermoelectric conversion element even if a P-type thermoelectric conversion part is made of a material containing a metal, and a method for manufacturing the thermoelectric conversion element.

BRIEF SUMMARY OF THE INVENTION

In accordance with one aspect of the invention, a thermoelectric conversion element comprising a laminated body having first and second opposing main surfaces which are spaced from each other along a first direction and first and second opposing end surfaces which are spaced from each other along a second direction. The second direction is perpendicular to the first direction. The laminated body comprises a plurality of first and second thermoelectric conversion parts which alternate with one another so as to define a plurality of thermoelectric conversion part pairs. Each thermoelectric conversion part pair includes a respective first thermoelectric conversion part and a respective second thermoelectric conversion part, a joint surface of the first thermoelectric part of the pair facing a joint surface of the second thermoelectric part of the pair. The laminated body further comprises a plurality of insulator layers, each insulator layer being associated with a respective thermoelectric conversion part pair, each insulator being located between a first portion of the facing joint surfaces of the first and second thermoelectric conversion parts of its respective thermoelectric conversion part pair, a second portion of the facing joint surfaces of the first and second thermoelectric conversion parts of each thermoelectric part pair being directly joined to one another. Each second thermoelectric conversion part has an end face opposing the first or second end surface of the laminated body with a portion of a respective one of insulator layers covering the end face and being located between the end face and the first or second end surface that the end face opposes.

In accordance with a further aspect of the invention, the laminated body has a central axis running parallel to the first direction and the thermoelectric conversion element further comprises first and second electrodes respectively provided on the first and second principal surfaces of the laminated body. The first and second electrodes each have a center that is offset from the central axis.

In accordance with another aspect of the invention, an electrode protection member covering a peripheral edge of the first electrode.

In accordance with another aspect of the invention, the end face of each of the insulating layers is curved to form a depression relative to the first or second end surface of the laminated body that it opposes.

In accordance with another aspect of the invention, the distance from the deepest part of each depression to the first or second end surface of the laminated body that is opposes is 10 µm.

In accordance with another aspect of the invention, the first thermoelectric conversion part is an oxide semiconductor, the second thermoelectric conversion part is a semiconductor comprising a metal, and the insulator layer is an oxide insulator.

In accordance with another aspect of the invention, the oxide semiconductor is an N-type semiconductor comprising a composite oxide, the semiconductor comprising the metal is a P-type semiconductor comprising Ni, Mo, and the composite oxide, the oxide insulator comprises $ZrO_2$, and the composite oxide comprises at least one of Sr, La, and Ti.

In accordance with another aspect of the invention, a portion of the respective one of the insulator layers covers the entire end face of its associated second thermoelectric conversion part.

In accordance with another aspect of the invention, the first and second electrode protection members cover respective peripheral edges of the first and second electrodes.

In accordance with another aspect of the invention, a method for forming a thermoelectric conversion element includes the following steps. Forming a first insulator paste layer provided with a first slit on an oxide thermoelectric conversion material sheet acting as a base for the first thermoelectric conversion part. Forming a metal thermoelectric conversion material paste layer covering the first slit on the first insulator paste layer. Forming a second insulator paste layer around the metal thermoelectric conversion material paste layer on the first insulator paste layer. Forming a third insulator paste layer covering the metal thermoelectric conversion material paste layer and the second insulator paste layer, the third insulator paste layer provided with a second slit. Producing a laminated body comprising the oxide thermoelectric conversion material sheet, the metal thermoelectric conversion material paste layer, the first insulator paste layer, the second insulator paste layer, and the third insulator paste layer. Firing the laminated body.

According to the present invention, the insulator layer covers the end surfaces of the second thermoelectric conversion part, and the second thermoelectric conversion part is not exposed at the outer surface of the thermoelectric conversion element. Thus, the material that forms the second thermoelectric conversion parts are kept from chemically reacting with the corrosive gas present around the thermoelectric conversion element, thereby preventing impurities from being formed in the second thermoelectric conversion parts. Therefore, degradation of electrical characteristics of the thermoelectric conversion element is suppressed, which is caused by the corrosive gas present around the thermoelectric conversion element. More specifically, even if the P-type thermoelectric conversion parts are made of a material containing a metal, it is possible to suppress degradation of electrical characteristics in the thermoelectric conversion element.

DETAILED DESCRIPTION OF THE PREFERRED EMBODIMENTS

Figure 1:
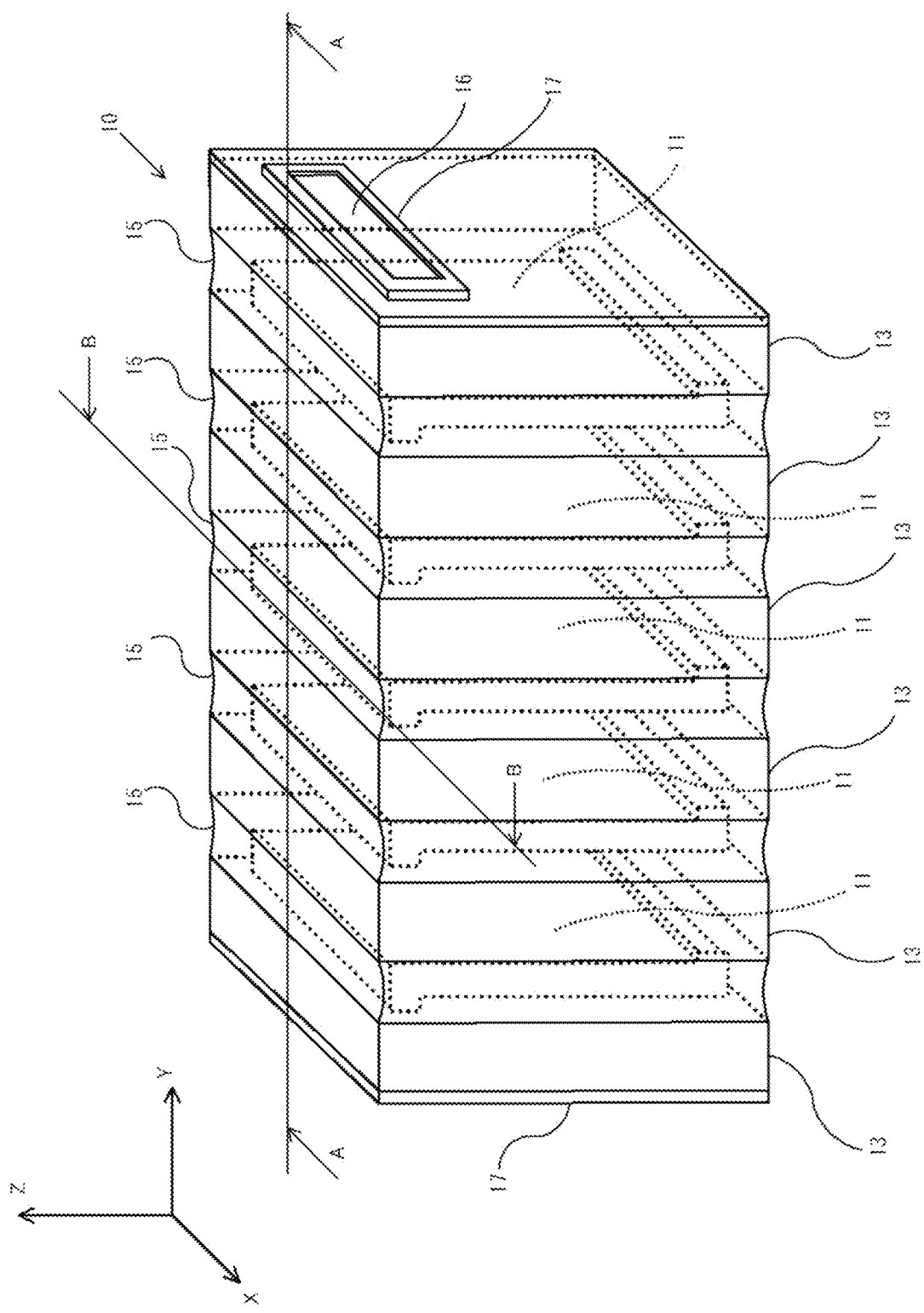
FIG. 1 is a perspective view of a first preferred embodiment of a thermoelectric conversion element according to the present invention.
Figure 2:
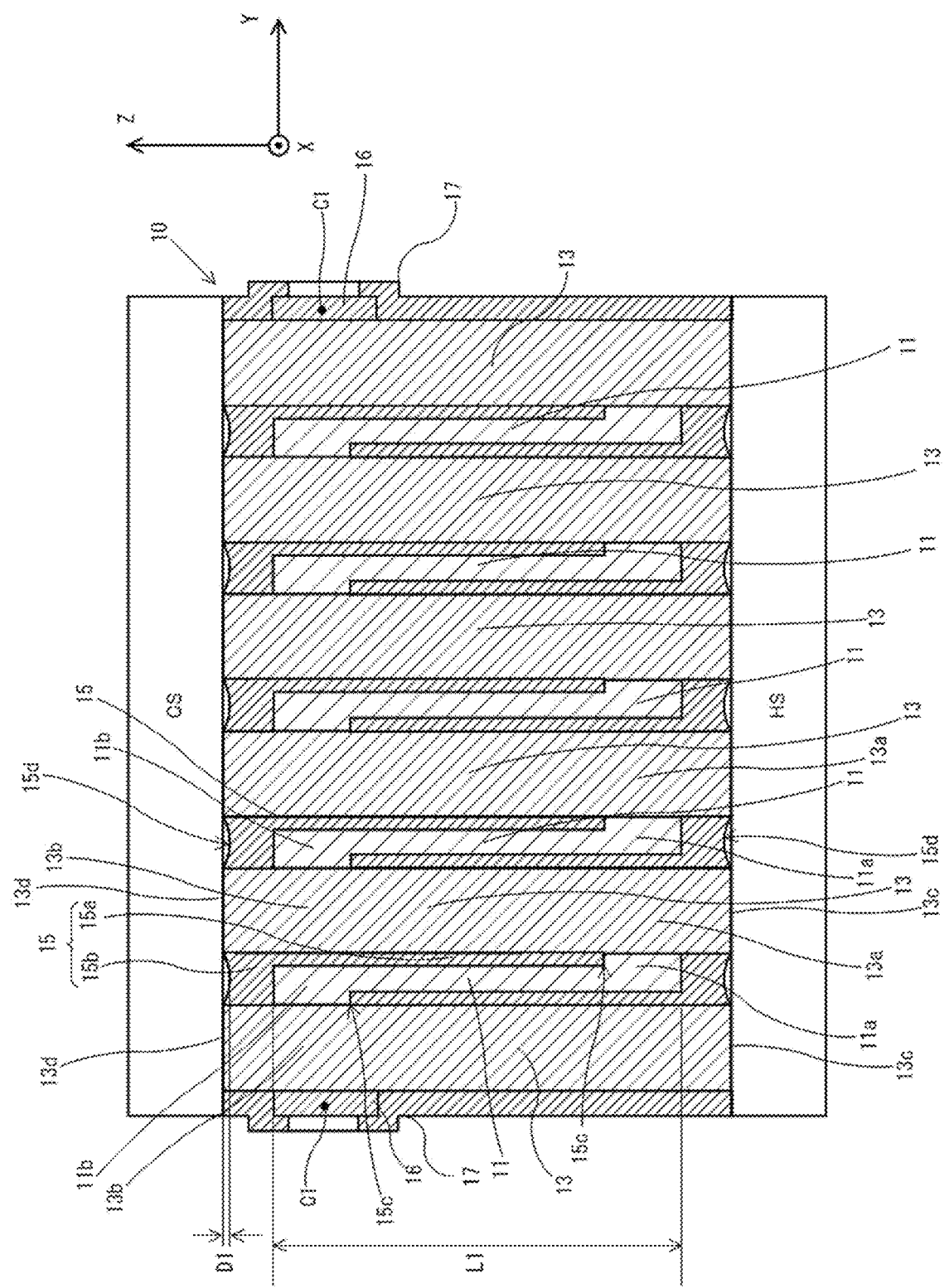
FIG. 2 is a cross-sectional view of the thermoelectric conversion element taken along line A-A in FIG. 1.
Figure 3:
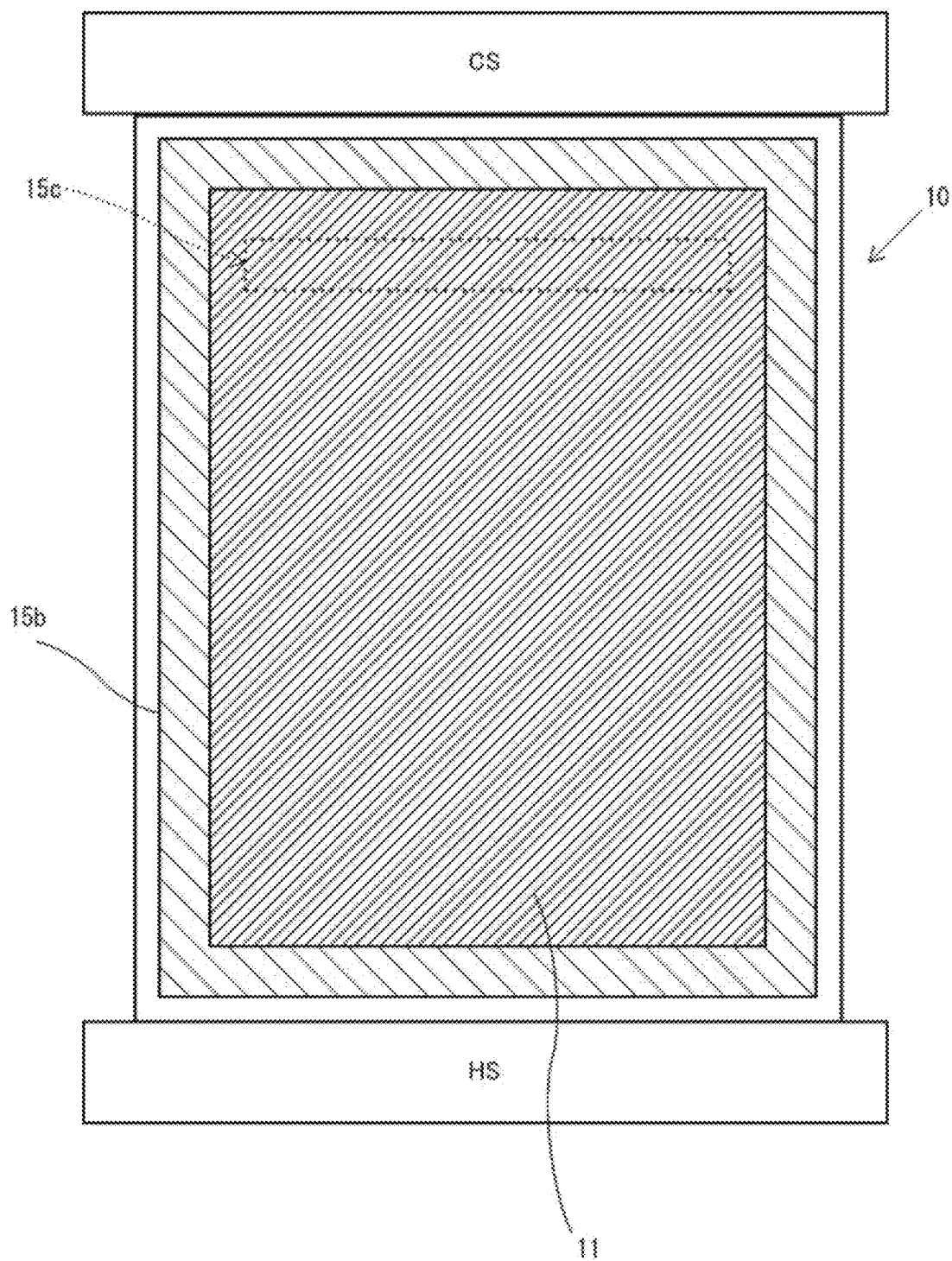
FIG. 3 is a cross-sectional view of the thermoelectric conversion element according taken along line B-B in FIG. 1.

As shown in FIGS. 1 and 2, a thermoelectric conversion element 10 according to the first preferred embodiment includes: a laminated body including a plurality of first thermoelectric conversion parts 13, a plurality of second thermoelectric conversion parts 11, a plurality of insulator layers 15, an electrode 16, and an electrode protection member 17. It is to be noted that in the description of the first preferred embodiment, explanations will be given with reference to the coordinate system shown in the drawings. The +Z direction in FIG. 1 will be referred to as an upward direction and the −Z direction will be referred to as as a downward direction. As shown in FIG. 2, the thermoelectric conversion element 10 generates electric power while being thermally coupled to a heat source HS located on the lower side (−Z direction side) of the thermoelectric conversion element 10 and a cold source CS located on the upper side (the +Z direction side in FIG. 1) of the thermoelectric conversion element 10, which has a lower temperature than that of the heat source. In this embodiment the heat source HS and the cold source CS have flat surfaces in contact with the thermoelectric conversion element 10. A heat sink having a metal flat plate thermally coupled with a heat radiation fin or a refrigerant pipe can be used, by way of example, as the cold source CS. A metal flat plate which is thermally coupled with an exhaust heat pipe installed in a factory or the like can be used, by way of example, as the heat source HS. In addition, depending on the electric power required, a plurality of thermoelectric conversion elements 10 may be used with the elements connected in series or in parallel.

In the preferred embodiment, each of the plurality of first and second thermoelectric conversion parts 13 and 11 takes the form of a foil. The plurality of first and second thermoelectric conversion parts 13 and 11 are alternately arranged in the Y axis direction of FIG. 1 and are joined to each other with the insulator layer 15 interposed there between. More particularly, and as shown in FIGS. 1 and 2, the thermoelectric conversion element 10 includes a plurality of adjacent pairs of first and second thermoelectric conversion parts 13 and 11. For example, the leftmost first thermoelectric conversion part 13 and the leftmost second thermoelectric conversion part 11 (all as viewed in FIG. 2) form a first pair of first and second thermoelectric conversion parts, the leftmost second thermoelectric conversion part 11 and the second to leftmost first conversion part 13 form a second pair of first and second thermoelectric conversion parts, etc.

In each thermoelectric conversion part pair, the first thermoelectric conversion part 13 of the pair has a first joint surface (e.g., the rightmost surface of the leftmost first thermoelectric part 13 in FIG. 2) and the second thermoelectric conversion part 11 of the pair has a second joint surface (e.g., the leftmost surface of the leftmost second thermoelectric part 13 in FIG. 2) which face one another. A first portion of the first and second joint surfaces (e.g. the portion adjacent portions 13b and 11b of the first and second thermoelectric parts 13 and 11) are joined directly to each other. The remainder of the first and second joint surfaces are joined with an insulator layer 15 interposed there between. The location of the portion of the first and second joint surfaces that are in direct contact alternate for each consecutive pair of thermoelectric conversion parts setting up a serpentine path for electricity flowing between the opposite lateral ends of the thermoelectric conversion element 10 as viewed in FIG. 2.

The plurality of first thermoelectric conversion parts 13, the plurality of second thermoelectric conversion parts 11, and the insulator layer 15 comprise the laminated body with two surfaces (a first principal surface and a second principal surface) located at opposite ends in the Y axis direction and end surfaces located at opposite ends in the Z axis direction (which is perpendicular to the Y axis direction). Each of the first thermoelectric conversion parts 13 has opposed end surfaces 13c, 13d which are perpendicular to the Z axis. The respective end surfaces 13c and 13d of the plurality of first thermoelectric conversion parts 13 are formed so as to lie in a common plane such that the respective end surfaces 13c, 13d of the plurality of first thermoelectric conversion portions 13 are flush with each other.

The first thermoelectric conversion part 13 is preferably an oxide semiconductor. Such an oxide semiconductor includes, for example, a composite oxide represented by a composition formula: ATiO3, which has a perovskite structure. Such a composition is defined as an N-type semiconductor. In this regard, A in the composition formula: ATiO3 may be La1-xSrx with Sr substituted with La in the range of 0≤x<0.2, for example, (Sr0.965La0.035)TiO3. The N-type semiconductor including the foregoing complex oxide is chemically stable against corrosive gases such as hydrogen sulfide and oxidizing gases.

The second thermoelectric conversion part 11 includes, for example, an NiMo alloy and a composite oxide represented by a composition formula: ATiO3, which has a perovskite structure. Such a composition is defined as a P-type semiconductor. In other words, the second thermoelectric conversion part 11 is defined as a semiconductor including a metal. In this regard, A in the composition formula: ABO3 may be La1-xSrx with Sr substituted with La in the range of 0≤x<0.2, for example, (Sr0.965La0.035)TiO3.

Each insulator layer 15 preferably includes first and second insulator parts 15b and 15a which are integrally molded to each other. Each insulator layer is located between a respective pair of first and second thermoelectric parts 13 and 11 with the second insulator part 15a interposed therebetween. The first thermoelectric conversion part 13 and the second thermoelectric conversion part 11 are joined to each other through a through hole 15c formed in the insulator part 15a.

As best shown in FIG. 2, each first insulator part 15b covers the upper or lower end of its associated second thermoelectric conversion part 11 in the ±X direction and ±Z direction and surrounds the periphery of its associated second thermoelectric conversion part 11, as viewed in a cross section taken along line B-B in FIG. 1. In addition, each of the first insulator parts 15b have a depressed part 15d which is recessed toward the center of the second thermoelectric conversion part 11 in the Z axis direction from the both end surfaces 13c, 13d of the first thermoelectric conversion part 13 in the Z axis direction. More specifically, the end surface of each of the insulator layers 15 has a depressed part 15d formed to be depressed toward the center of the laminated body in the X and Z axis directions from the end surfaces of the first thermoelectric conversion part 13 in the X axis direction and the Z axis direction. For each depressed part 15d, a depth D1 from the end surfaces 13c, 13d to the deepest part of the depressed part 15d is set to be, for example, 10 μm or less. Because each first insulator part 15b has the depressed part 15d, the direct contact with the cold source CS or the heat source HS is minimized. In contrast, the respective end surfaces 13c, 13d of the plurality of first thermoelectric conversion parts 13 are flush with each other, thereby bringing the respective end surfaces 13c of the plurality of first thermoelectric conversion parts 13 into surface contact with the heat source HS and bringing the respective end surfaces 13d of the plurality of first thermoelectric conversion parts 13 into surface contact with the cold source CS.

Each of the insulator layers 15 is preferably formed from an oxide insulator material which has electrical insulation properties. As this oxide insulator material, for example, ZrO2 with Y2O3 added thereto as a stabilizer (yttria-stabilized zirconia) can be used. This oxide insulator material containing ZrO2 is chemically stable against corrosive gases such as hydrogen sulfide and oxidizing gases.

As shown in FIG. 2, electrodes 16 are provided on the leftmost and rightmost first thermoelectric conversion parts 13, that is, they are provided on opposite principal surfaces (the first principal surface and the second principal surface) of the laminated body in the Y axis direction. The geometric centers C1 of the electrodes 16 are located on the +Z direction side from the center of the first thermoelectric conversion parts 13 in the Z axis direction, that is, on the side close to the cold source CS. More specifically, the electrode 16 is provided to locate, in a plan view from the Y axis direction, an imaginary line passing through the center of a line segment connecting both principal surfaces of the first thermoelectric conversion element 13 in the Z axis direction and parallel to the end surfaces of the first thermoelectric conversion elements 13 in the Z axis direction at the opposed principal surfaces of the laminated body in the Y axis direction in a different manner from an imaginary line passing through the center C1 of the electrode 16 and parallel to the both end surfaces of the first thermoelectric conversion element 13 in the Z axis direction.

The electrodes 16 are preferably composed of a base layer formed of Ni and a contact layer coating the base layer. The contact layer has a laminated structure of an Ni layer and an Sn layer. The thickness of the Ni layer is set to be 3 to 5 μm, and the thickness of the Sn layer is preferably set to be 4 to 6 μm. For example, a lead wire (not shown) for drawing the electric power generated in the thermoelectric conversion element 10 is bonded to the electrode 16. The lead wire connected to the electrode 16 is connected to, for example, a power supply management circuit or a wireless communication circuit. In this case, the thermoelectric conversion element 10 functions as a power supply for driving a power supply management circuit and a wireless communication circuit.

A respective electrode protection member 17 covers a peripheral edge of each of the electrodes 16. Specifically, each electrode protection member 17 covers the peripheral edge of its associated electrode 16 as well as the first and second principal surfaces (the left and right edge surfaces as viewed in FIG. 2) of the laminated body. Each of the electrode protection members 17 are preferably formed from an oxide insulator material which has electrical insulation properties. As with the insulator layer 15, ZrO2 with Y2O3 added thereto as a stabilizer (yttria-stabilized zirconia), for example, is adopted as this oxide insulator material.

As shown by way of example in FIG. 2, the heat source HS makes contact with the end surface of the thermoelectric conversion element 10 in the −Z direction (i.e., the lower end surface as viewed in FIG. 2), and the cold source CS makes contact with the end surface of the thermoelectric conversion element 10 in the +Z direction (i.e., the upper end surface as viewed in FIG. 2). In this case, due to the Seebeck effect, electrons move in the +Z direction in the first thermoelectric conversion part 13 to generate a current flowing in the −Z direction, whereas holes move in the +Z direction in the second thermoelectric conversion element 11 to generate a current flowing in the +Z direction. Thus, a current flowing in the +Y direction is generated in the thermoelectric conversion element 10.

Next, the results of evaluating the corrosion resistance, the electrode shape dependence of the power generation capacity, and the adhesion strength of the electrode will be described for the thermoelectric conversion element 10 according to the first preferred embodiment. The inventors have evaluated the corrosion resistance and the electrode shape dependence of the power generation capacity for both the thermoelectric conversion element 10 according to the first preferred embodiment and thermoelectric conversion elements according to Comparative Examples 1 and 2 as described below. The evaluation on the adhesion strength of the electrode was made with the use of two kinds of evaluation samples. One of the samples is a first sample that imitates the first thermoelectric conversion parts 13 of the thermoelectric conversion element 10, provided with the electrode 16, and the other is a second sample that imitates the configuration of the first thermoelectric conversion parts 13 provided with the electrode 16, but without the electrode protection member 17. First, the thermoelectric conversion elements and the first sample and the second sample for the evaluations will be described which were prepared by the inventors.

A thermoelectric conversion element of about 6 mm in length in the X axis direction, about 7 mm in length in the Y axis direction, and about 2.7 mm in length in the Z axis direction, including 50 layers of second thermoelectric conversion parts 11 and 51 layers of first thermoelectric conversion parts 13 were prepared as the thermoelectric conversion element 10 according to the first preferred embodiment. In addition, the thickness of the second thermoelectric conversion part 11, the thickness of the first thermoelectric conversion part 13, and the thickness of the second insulator part 15a were respectively set to be about 200 μm, about 30 μm and about 5 μm, respectively.

Figure 4A:
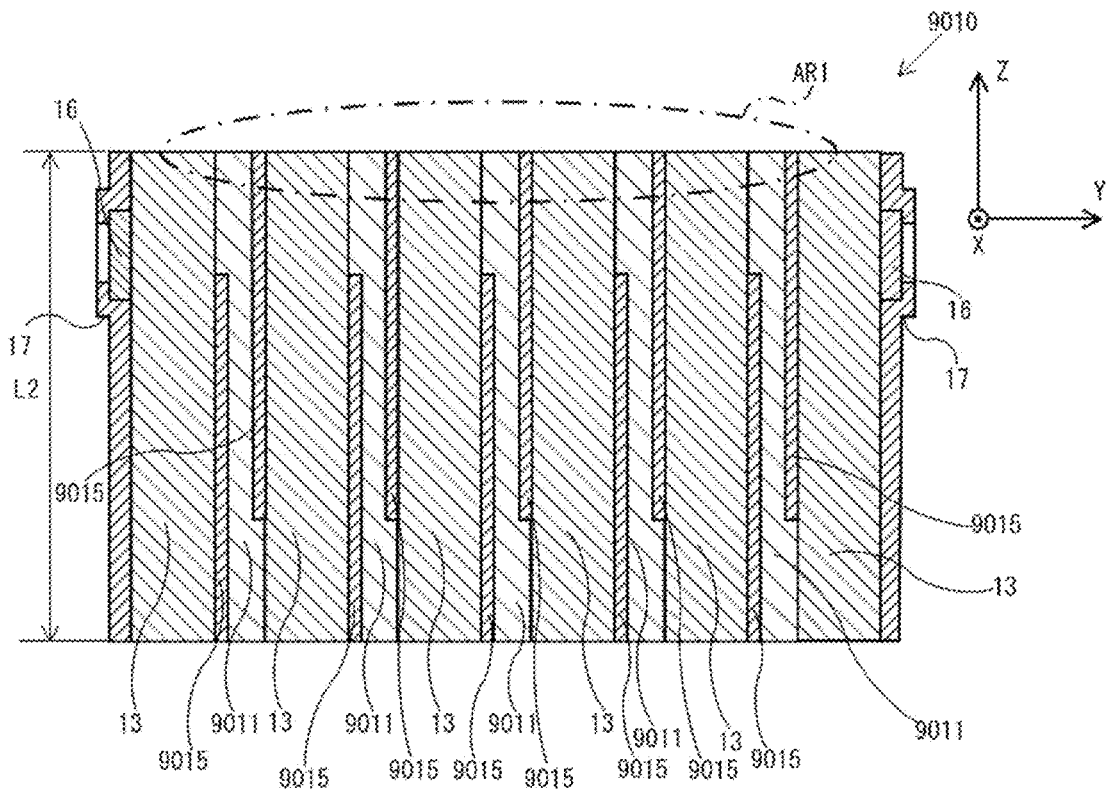
FIG. 4A is a cross-sectional view of a thermoelectric conversion element according to Comparative Example 1.

As shown in FIG. 4A, a thermoelectric conversion element 9010 according to Comparative Example 1 has second thermoelectric conversion parts 9011 partially exposed at the outer surface of the thermoelectric conversion element 9010. It is to be noted that in FIG. 4A, the same constituent parts as those in the embodiment are denoted by the same reference numerals as those in FIG. 2. The outer dimensions of the thermoelectric conversion element 9010, the number of first thermoelectric conversion parts 13, and the thickness of the first thermoelectric conversion part 13 were adapted to be the same as those of the previously described thermoelectric conversion element 10 for the evaluations. In addition, the number of second thermoelectric conversion parts 9011 and the thicknesses of the second thermoelectric conversion part 9011 and the insulator layer 9015 were adapted to be the same as the number of second thermoelectric conversion parts 11 and the thicknesses of the second thermoelectric conversion part 11 and a second insulator section 15a for the thermoelectric conversion element 10 for the evaluations.

Figure 4B:
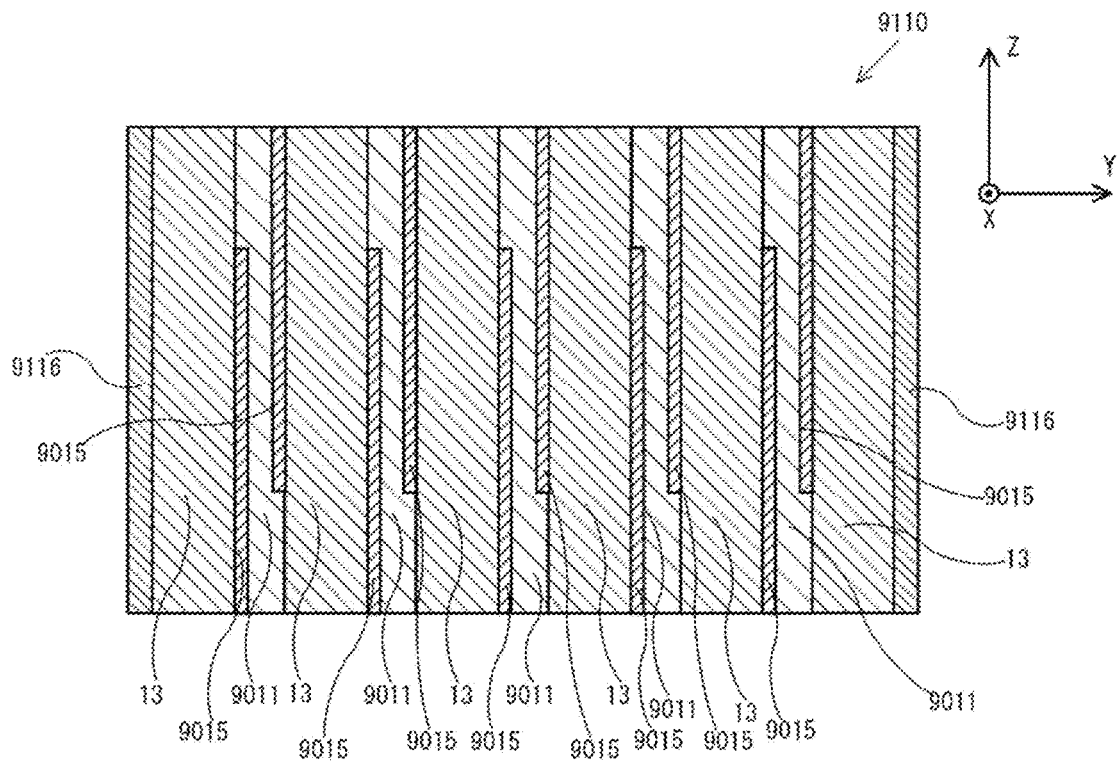
FIG. 4B is a cross-sectional view of a thermoelectric conversion element according to Comparative Example 2.

As shown in FIG. 4B, a thermoelectric conversion element 9110 according to Comparative Example 2 has an electrode 9116 provided to cover the entire surfaces of first thermoelectric conversion parts 13, perpendicular to the Y axis direction. It is to be noted that in FIG. 4B, the same constituent parts as those in Comparative Example 1 are denoted by the same reference numerals as those in FIG. 4A. In addition, the outer dimensions of the thermoelectric conversion element 9110, the numbers of second thermoelectric conversion parts 9011 and first thermoelectric conversion parts 13, the thicknesses of the second thermoelectric conversion part 9011, the first thermoelectric conversion part 13, and an insulator layer 9015 are adapted to be the same as those of the previously described thermoelectric conversion element 9010 for the evaluations.

The first sample includes a base material made of an N-type oxide semiconductor material, an electrode that is rectangular in a plan view, provided on one surface of the base material, and an electrode protection member formed so as to cover a peripheral edge of the electrode, and a first principal surface and a second principal surface of the laminated body. This first sample was prepared by applying an Ni paste to be described as a base for the base layer of the electrode and an insulator paste as a base for the electrode protection member to an N-type oxide semiconductor material sheet to be described, then firing the pastes, and forming a contact layer coating the base layer by an electrolytic plating method. The shape of the electrode was rectangular in a plan view, and the size thereof was adjusted to 2 mm×2 mm.

The second sample includes a base material made of an N-type oxide semiconductor material, and an electrode that is rectangular in a plan view, provided on one surface of the base material. This second sample was prepared by applying an Ni paste to be described as a base for the base layer of the electrode to an N-type oxide semiconductor sheet to be described, then firing the pastes, and forming a contact layer coating the base layer by an electrolytic plating method. The shape of the electrode was rectangular in a plan view, and the size thereof was adjusted to 2 mm×2 mm.

Next, the respective evaluation methods for evaluating the corrosion resistance, the electrode shape dependence of the power generation capacity, and the adhesion strength of the electrodes 16, and the evaluation results obtained by implementing the respective evaluation methods will be described.

The evaluation of the corrosion resistance was made by comparing the thermoelectric conversion element 10 and the thermoelectric conversion element 9010 with the second thermoelectric conversion part 9011 exposed to the outside. For this evaluation, 12 samples were prepared for each of the thermoelectric conversion elements 10, 9010 for the evaluation, and subjected to a gas corrosion test. In accordance with this gas corrosion test, the thermoelectric conversion elements 10, 9010 for the evaluation were, after the measurement of the initial output voltages before the exposure to a corrosive gas, left for 240 hours in a test tank maintained in the atmosphere in which the corrosive gas was dispersed, and thereafter, the post-exposure output voltages were measured again. Then, the average value for the initial voltage and the average value for the post-exposure voltage were compared for each of the thermoelectric conversion elements 10, 9010. $H_2S$ and $SO_2$ were used as the corrosive gas. In addition, the inside of the test tank was maintained in an atmosphere of 3 ppm in $H_2S$ concentration and 10 ppm in $SO_2$ concentration at a temperature of 40° C. and humidity of 85%. The conditions for this gas corrosion test are intended to mimic general outdoor use (excluding the use in areas with high environmental burdens, such as hot spring areas), specified by the Technical Standard DN8J112A. In addition, the output voltages were measured by keeping the temperature of the heat source in contact with the lower sides of the thermoelectric conversion elements 10, 9010 at 30° C. and keeping the temperature of the cold source CS in contact with the upper sides of the thermoelectric conversion elements 10 and 9010 at 20° C.

In addition, the inventors observed, with an SEM, the thermoelectric conversion elements 10, 9010 after the exposure to the corrosive gas, analyzed deposits thereof through the use of μ-XRD (X-ray diffractometry), and analyzed the components thereof through the use of WDX (wavelength-dispersive X-ray spectrometry). In the component analysis through the use of WDX, polishing the upper end surface of the thermoelectric conversion element 9010 to reach a preset depth, and then measuring the distribution of an S (sulfur) component at the polished surface by WDX were repeated and carried out to investigate the penetration depth of the S component into the thermoelectric conversion element 9010.

As a result of measuring the output voltage, in the case of the thermoelectric conversion element 9010, the average value for the initial voltage was 66 mV, and the average value for the post-exposure voltage was 10 mV. On the other hand, in the case of the thermoelectric conversion element 10, the average value for the initial voltage was 63 mV, and the average value for the post-exposure voltage was 63 mV. As just described, in the case of the thermoelectric conversion element 9010, the average value for the post-exposure voltage was decreased by 56 mV from the average value for the initial voltage, whereas in the case of the thermoelectric conversion element 10, the average value for the post-exposure voltage was the same as the average value of the initial voltage. The reason that the average value for the initial voltage of the thermoelectric conversion element 10 is 3 mV lower than the average value for the initial voltage of the thermoelectric conversion element 9010 is because the length L1 (FIG. 2) of the second thermoelectric conversion part 11 in the Z axis direction is shorter than the length L2 (FIG. 4A) of the second thermoelectric conversion part 9011 in the Z axis direction. If the length L1 of the second thermoelectric conversion part 11 in the Z axis direction was equal to the length L2 of the second thermoelectric conversion part 9011 in the Z axis direction, the output voltage of the thermoelectric conversion element 10 would also equal to the output voltage of the thermoelectric conversion element 9010.

Figure 5:
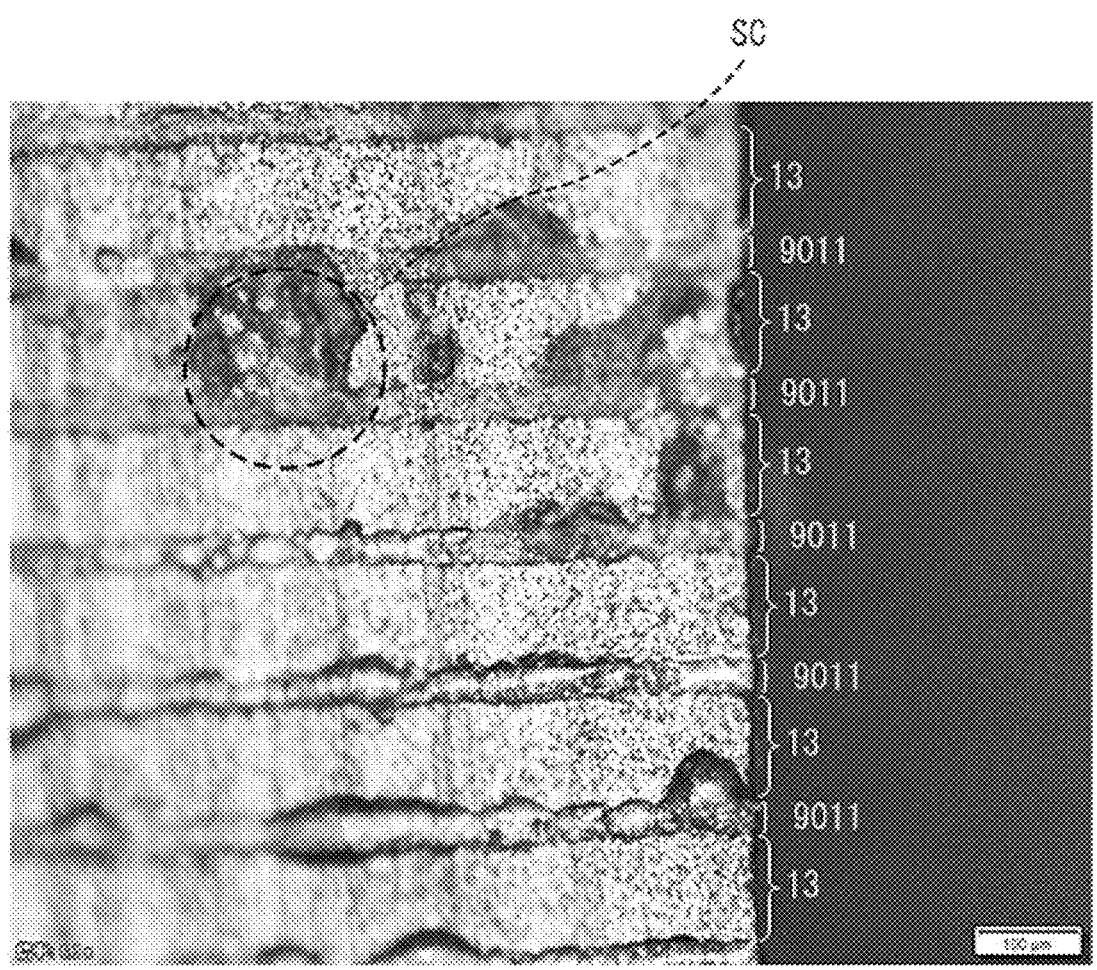
FIG. 5 is an SEM photograph of a part of the thermoelectric conversion element according to Comparative Example 1.

In addition, the observation of the surface of the thermoelectric conversion element 9010 with an SEM has confirmed the presence of a deposit on the surface of the thermoelectric conversion element 9010 as shown in SC of FIG. 5. From the analysis through the use of μ-XRD, it has been confirmed that the deposit is a hydrate of nickel sulfate. In addition, from the component analysis through the use of WDX, it has been confirmed that the S element included in the hydrate of nickel sulfate is present throughout the second thermoelectric conversion part 9011, whereas no S element is present in the first thermoelectric conversion parts 13 and the insulator layers 9015. On the other hand, the observation of the surface of the thermoelectric conversion element 10 with the SEM has confirmed the absence of deposits on the surface of the thermoelectric conversion element 10. In addition, the component analysis through the use of WDX has confirmed that no S element is present in any of the second thermoelectric conversion parts 11, the first thermoelectric conversion parts 13, and the insulator layers 15.

These results can be considered as follows. In the case of the thermoelectric conversion element 9010 (FIG. 4A), the second thermoelectric conversion parts 9011 containing Ni are exposed at the outer surface of the thermoelectric conversion element 9010 in the area AR1 indicated by a dashed line in FIG. 4A. Therefore, when the thermoelectric conversion element 9010 is exposed to a corrosive gas such as sulfur, the Ni included in the second thermoelectric conversion parts 9011 will react with the corrosive gas to form a hydrate of nickel sulfate. Further, the formation of such an impurity in the second thermoelectric conversion parts 9011 inhibits the movement of carriers in the second thermoelectric conversion parts 9011, thereby decreasing the output voltage of the thermoelectric conversion element 9010.

On the other hand, in the case of the thermoelectric conversion element 10 shown in FIGS. 1 and 2, the ends of the second thermoelectric conversion parts 11 in the ±X and ±Y directions are covered with the first insulator part 15*b*, and are not exposed at the outer surface of the thermoelectric conversion element 10. In addition, as can be seen from the confirmation that no S element is present in the first thermoelectric conversion parts 13 or the insulator layer 15 in the component analysis through the use of WDX, the materials that form the second thermoelectric conversion parts 13 and the insulator layer 15 are less likely to react with corrosive gases. Thus, impurities are less likely to be formed in the second thermoelectric conversion parts 11, and the output voltage of the thermoelectric conversion element 10 are kept from fluctuating before and after the exposure to corrosive gases.

In order to evaluate the electrode shape dependence of power generation capacity, 12 samples were prepared for each of the thermoelectric conversion elements 10, 9110 for the evaluation and subjected to output voltage measurement. The twelve thermoelectric conversion elements 10 for the evaluation were prepared separately from the twelve thermoelectric conversion elements 10 used for the evaluation of corrosion resistance. The shapes of the electrodes 16, 9116 of the thermoelectric conversion elements 10, 9110 are different from each other as described previously. The output voltages were measured by keeping the temperature of the heat source HS in contact with the lower sides of the thermoelectric conversion elements 10, 9110 at 30° C. and keeping the temperature of the cold source CS in contact with the upper sides of the thermoelectric conversion elements 10, 9010 at 20° C.

When the output voltage of the thermoelectric conversion element 9110 was measured, the average value for the output voltage was 66 mV. On the other hand, when the output value of the thermoelectric conversion element 10 was measured, the average value for the output voltage was 70 mV. As just described, it has been found that the output voltage of the thermoelectric conversion element 10 is 4 mV higher than the output voltage of the thermoelectric conversion element 9110.

The reason for this result can be considered as follows. For the thermoelectric conversion element 9110, as shown in FIG. 4B, the electrode 9116 covers the entire lateral surfaces of the first thermoelectric conversion parts 13. In addition, the material that forms the electrode 9116 is a metal, and thermal conductivity thereof is higher than the thermal conductivity of the material that forms the second thermoelectric conversion parts 9011 and the first thermoelectric conversion parts 13. On the other hand, the electrode 16 of the thermoelectric conversion element 10, which is, as shown in FIG. 2, provided on only a part of the lateral sides of the outermost first thermoelectric conversion sections 13, does not serve as a heat transport pathway from the end of the thermoelectric conversion element 10 in the −Z direction to the end thereof in the +Z direction. Thus, the amount of heat transported from the end of the thermoelectric conversion element 9110 in the −Z direction to the end of the thermoelectric conversion element 9110 in the +Z direction is larger than the amount of heat transported from the end of the thermoelectric conversion element 10 in the −Z direction to the end of the thermoelectric conversion element 10 in the +Z direction. In addition, for the thermoelectric conversion element 10, the electrodes 16 are located on the +Z direction side from the center of the first thermoelectric conversion parts 13 in the Z axis direction, that is, on the side close to the cold source CS. Thus, heat at the end of the thermoelectric conversion element 10 in the +Z direction is more likely to be released to the outside through the rightmost electrode 16, and accordingly, the temperature of the end of the thermoelectric conversion element 10 in the +Z direction is less likely to be increased. From these facts, the temperature difference between the end of the thermoelectric conversion element 10 in the −Z direction and the end thereof in the +Z direction is larger as compared with the temperature difference between the end of the thermoelectric conversion element 9110 in the −Z direction and the end thereof in the +Z direction. Therefore, the output voltage of the thermoelectric conversion element 10 is higher as compared with the output voltage of the thermoelectric conversion element 9110.

In order to evaluate the adhesion strength of the electrode 16, lead wires were soldered to the electrodes of the first sample and second sample described previously, then, the lead wires were pulled in a direction away from the base materials, and in the case of electrode peeling, the tensile strength was measured.

The tensile strength in the case of electrode peeling was 9.8 N in the second sample, whereas the average value for the tensile strength in the case of electrode peeling was 21 N in the first sample. From this result, we conclude that providing the electrode protection members 17 suppresses peeling of the electrode 16 in the case of the thermoelectric conversion element 10, as compared with the case with no electrode protection member 17 provided.

As described above, for the thermoelectric conversion element 10 according to the first preferred embodiment, as shown in FIGS. 1 and 2, the ends of the second thermoelectric conversion parts 11 in the ±X direction and ±Z direction are covered with the first insulator parts 15b which is chemically stable against corrosive gases, and the second thermoelectric conversion parts 11 are not exposed at the outer surface of the thermoelectric conversion element 10. Thus, the material that forms the second thermoelectric conversion parts 11 are prevented from chemically reacting with the corrosive gas present around the thermoelectric conversion element 10, thereby preventing impurities from being formed in the second thermoelectric conversion parts 11. As a result, degradation of electrical characteristics of the thermoelectric conversion element 10 which is caused by the corrosive gas present around the thermoelectric conversion element 10, is suppressed.

It is possible to form the thermoelectric conversion element 9010 according to Comparative Example 1 to include an insulator layer that is chemically stable to corrosive gases and covers the entire thermoelectric conversion element 9010. In such a case the insulator layer prevents the corrosive gas present around the thermoelectric conversion element 9010 from coming into contact with the second thermoelectric conversion parts 9011. While this achieves at least some of the improved results of the invention, this is not as preferable as the structure of the first preferred embodiment because the manufacturing method to a make such a structure requires a step of forming an insulator layer that covers the entire thermoelectric conversion element 9010, thereby increasing the number of steps. In contrast, the method for manufacturing the thermoelectric conversion element 10 according to the first preferred embodiment does not require a step of forming an insulating layer that covers the entire thermoelectric conversion element 10. Thus, simplification of the manufacturing method can be achieved by reducing the number of steps.

In addition, the electrode 16 of the thermoelectric conversion element 10 according to the first preferred embodiment, which is, as shown in FIG. 2, provided partially on the first thermoelectric conversion section 13, will not serve as a heat transport pathway from the end of the thermoelectric conversion element 10 in the −Z direction to the end thereof in the +Z direction. In addition, the electrode 16 is located on the +Z direction side from the center of the first thermoelectric conversion part 13 in the Z axis direction, that is, on the side close to the cold source CS. Thus, heat at the end of the thermoelectric conversion element 10 in the +Z direction is more likely to be released to the outside through the rightmost electrode 16, and accordingly, the temperature of the end of the thermoelectric conversion element 10 in the +Z direction is less likely to be increased. From these facts, the temperature difference between the end of the thermoelectric conversion element 10 in the −Z direction and the end thereof in the +Z direction is larger as compared with the temperature difference between the end of the thermoelectric conversion element 9110 in the −Z direction and the end thereof in the +Z direction. Therefore, the output voltage of the thermoelectric conversion element 10 is higher as compared with the output voltage of the thermoelectric conversion element 9110.

Furthermore, for the thermoelectric conversion element 10 according to the first preferred embodiment, as shown in FIGS. 1 and 2, the electrode protection member 17 is provided so as to cover the peripheral edge of the electrode 16, thereby fixing the peripheral edge of the electrode 16 to the first thermoelectric conversion part 13 more firmly via the electrode protection member 17, and thus resulting in suppressed peeling of the electrode 16.

Now, if a thermal shock is applied, stress due to the thermal shock is concentrated on the peripheral edge of the electrodes 16, thus peeling the electrodes 16 off. In contrast, for the thermoelectric conversion element 10, the electrode protection members 17 are provided so as to cover the peripheral edge of the electrodes 16 in order to suppress peeling of the electrodes 16 from the peripheral edge. Thus, the peripheral edge of the electrodes 16 are firmly fixed to the first thermoelectric conversion parts 13 via the electrode protection members 17. Thus, when a thermal shock is applied to the thermoelectric conversion element 10, peeling of the electrodes 16 is suppressed.

In addition, the first insulator parts 15b according to the first preferred embodiment are formed from an oxide insulator material containing $ZrO_2$ that is chemically stable against corrosive gases such as hydrogen sulfide. In addition, the first thermoelectric conversion parts 13 are also formed from an N-type semiconductor containing a complex oxide that is chemically stable against corrosive gases. Thus, even if the thermoelectric conversion element 10 is used in an atmosphere in which hydrogen sulfide is dispersed, sulfide is prevented from being formed in the second thermoelectric conversion parts 11.

Next, a method for manufacturing the thermoelectric conversion element 10 according to the first preferred embodiment will be described with reference to FIGS. 6A to 6C and FIGS. 7A to 7C. First, an N-type oxide semiconductor material sheet as a base for the first thermoelectric conversion parts 13, a P-type semiconductor material paste as a base for the second thermoelectric conversion parts 11, and an insulator paste as a base for the insulator layer 15 and the electrode protection member 17 are produced in accordance with this manufacturing method.

For the production of the N-type oxide semiconductor material sheet, La2O3, SrCO3 and TiO2 are first weighed so that the molar ratios thereof meet 0.965:0.035:1. Next, the weighed powder materials of La2O3, SrCO3, and TiO2, with pure water added thereto, are then subjected to grinding and mixing with the use of a ball mill, thereby producing a slurry containing La2O3, SrCO3, and TiO2. Subsequently, the so produced slurry is dried and then subjected to calcination under the condition of 1300° C. in the atmosphere. As a result, a powder material of (Sr0.965La0.035)TiO3 is produced. It is to be noted that the particle size of the powder material is not particularly limited, but preferably determined so that La2O3, SrCO3, and TiO2 are mixed homogeneously. In addition, the method for the calcination is not to be considered particularly limited. In addition, the calcination temperature is not to be considered limited to 1300° C., but may be any other temperature as long as the temperature is 1000° C. or more.

Thereafter, a powder material of (Sr0.965La0.035)TiO3, an organic solvent such as toluene or ethanol, and a binder material such as polyvinyl butyral are mixed to produce a mixture containing (Sr0.965La0.035)TiO3. Next, the produced mixture is molded into a sheet, thereby forming the N-type oxide semiconductor material sheet as a base for the first thermoelectric conversion part 13, for example, with a thickness of 200 µm.

In the production of the P-type semiconductor material paste, the above-mentioned powder material of (Sr0.965La0.035)TiO3, an Ni powder material, and an Mo powder material are weighed. Specifically, the materials are weighed so that the molar ratio of Ni and Mo is 0.9:0.1, the combined ratio of Ni and Mo by weight is 80 wt %, and the ratio of the powder material of (Sr0.965La0.035)TiO3 by weight is 20 wt %. Subsequently, the powder material of (Sr0.965La0.035)TiO3, the Ni powder material, the Mo powder material, and an organic solvent such as a varnish are mixed with the use of a roll machine or the like, thereby producing the P-type semiconductor material paste as a base for the second thermoelectric conversion parts 11. It is to be noted that the particle sizes of the Ni powder material and Mo powder material are not particularly limited, but preferably determined so that the powder material of (Sr0.965La0.035)TiO3, the Ni powder material, and the Mo powder material are mixed homogeneously.

The insulator paste is produced by weighing a powder material of ZrO2 with Y2O3 added thereto and mixing the powder material of ZrO2 with Y2O3 added with an organic solvent such as a varnish with the use of a roll machine or the like. The average particle size of the powder material of ZrO2 is set so that the time until completing the sintered insulator paste is longer than the time until completing the sintered N-type oxide semiconductor sheet in the case of firing.

Figure 6A:
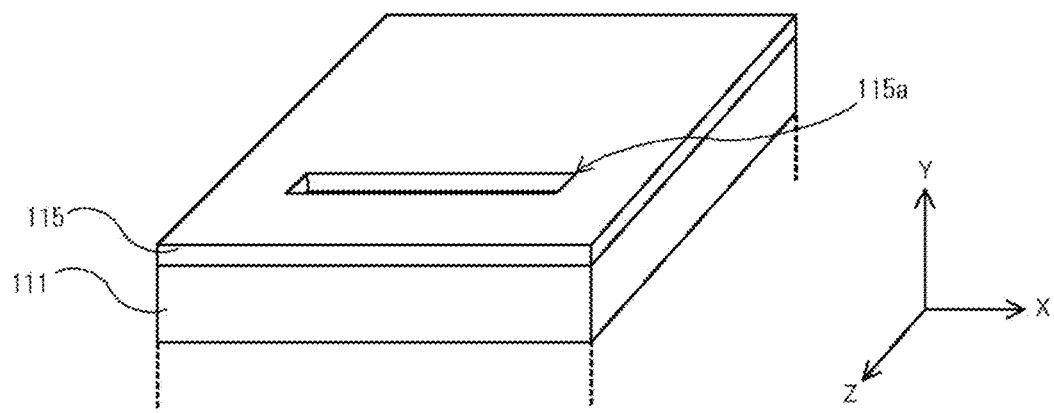
FIGS. 6A-6C are perspective views illustrating respective steps of a method for manufacturing a thermoelectric conversion element according to an embodiment of the invention.

Next, through the use of a printing technique, as shown in FIG. 6A, a first insulator paste layer 115 is formed on an N-type oxide semiconductor material sheet 111. The thickness of the first insulator paste layer 115 is, for example, 5 µm. The first insulator paste layer 115 is formed so that a part corresponding to the joint part between the first thermoelectric conversion part 13 and the second thermoelectric conversion part 11 in the N-type oxide semiconductor material sheet 111 is provided with a first slit 115a.

Figure 6B:
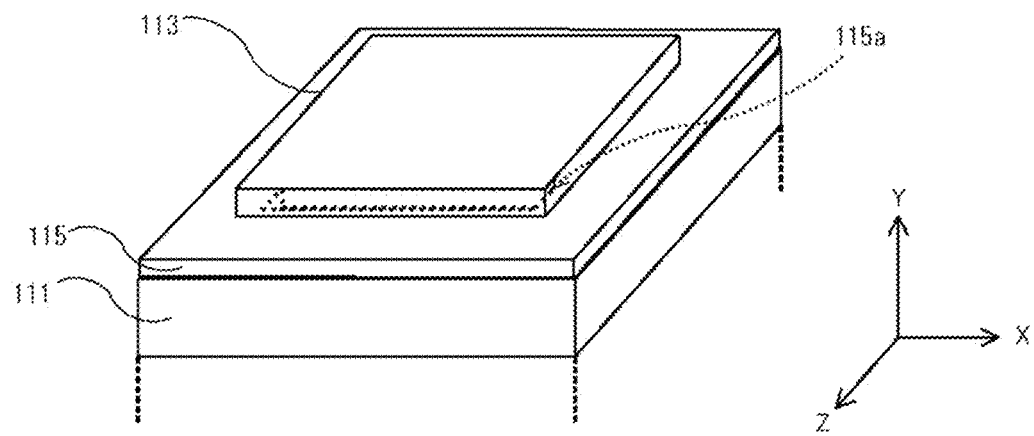

Subsequently, through the use of a printing technique, as shown in FIG. 6B, a P-type semiconductor material paste layer 113 is formed on the first insulator paste layer 115. The thickness of the P-type semiconductor material paste layer 113 is, for example, 50 µm. The P-type semiconductor material paste layer 113 is formed to cover a first slit 115a of the first insulator paste layer 115.

Figure 6C:
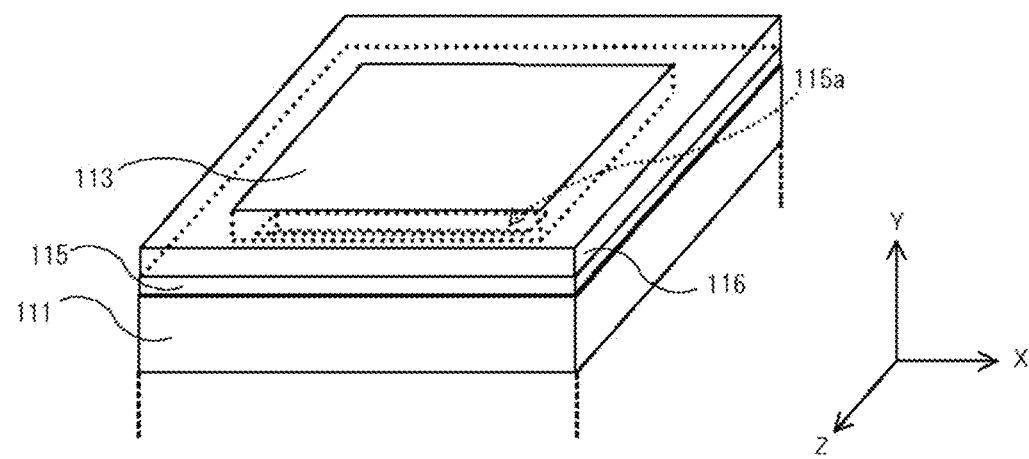

Thereafter, through the use of a printing technique, as shown in FIG. 6C, a second insulator paste layer 116 is formed around the P-type semiconductor material paste layer 113 on the first insulator paste layer 115. This second insulator paste layer 116 has the same thickness as the P-type semiconductor material paste layer 113.

Figure 7A:
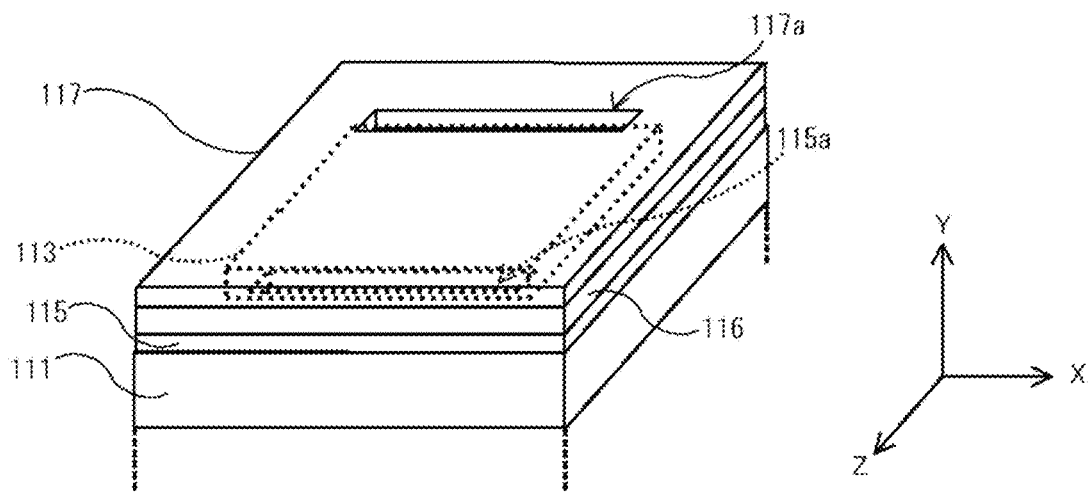
FIGS. 7A-7C are perspective views illustrating respective steps of the method for manufacturing a thermoelectric conversion element according to the embodiment.

Next, through the use of a printing technique, as shown in FIG. 7A, a third insulator paste layer 117 is formed so as to cover the P-type semiconductor material paste layer 113 and the second insulator paste layer 116. The thickness of the third insulator paste layer 117 is, for example, 5 µm. The third insulator paste layer 117 has a second slit 117a formed in a part corresponding to the joint part between the first thermoelectric conversion part 13 and the second thermoelectric conversion part 11 located at an end of the P-type semiconductor material paste layer 113 in the −Z direction.

Figure 7B:
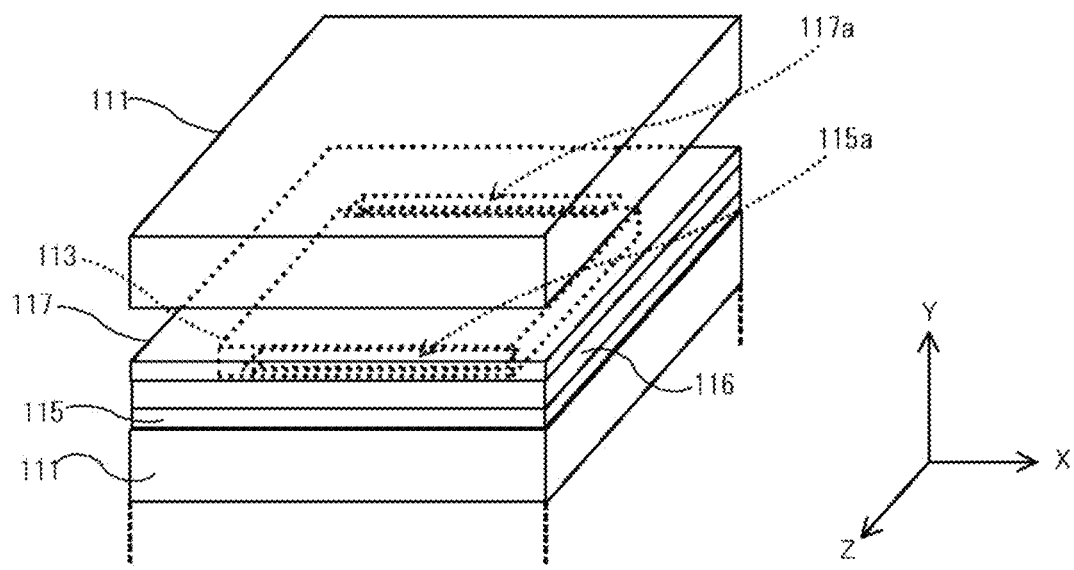

Subsequently, as shown in FIG. 7B, an N-type oxide semiconductor material sheet 111 is laminated on the third insulator paste layer 117. The series of process steps described above with reference to FIGS. 6A to 7B is repeated, thereby stacking, more than once, the N-type oxide semiconductor material sheet 111 with the P-type semiconductor material paste layer 113 and the insulator paste layers 115, 116, and 117 formed. In this regard, among the plurality of N-type oxide semiconductor material sheets 111, to the N-type oxide semiconductor material sheets 111 corresponding to the first thermoelectric conversion parts 13 located at opposite ends of the thermoelectric conversion element 10 in the Y axis direction, the Ni paste as a base for the electrode 16 and the insulator paste as a base for the electrode protection member 17 are applied in advance. These sheets are formed by applying the Ni paste as a base for the electrode 16 to the N-type oxide semiconductor material sheets 111 and then drying the Ni paste, and thereafter, applying the insulator paste as a base for the electrode protection member 17 so as to cover peripheral edges of the parts coated with the Ni paste, and then drying the insulator paste. The Ni paste is produced by mixing an Ni powder material and an organic solvent such as a varnish.

Figure 7C:
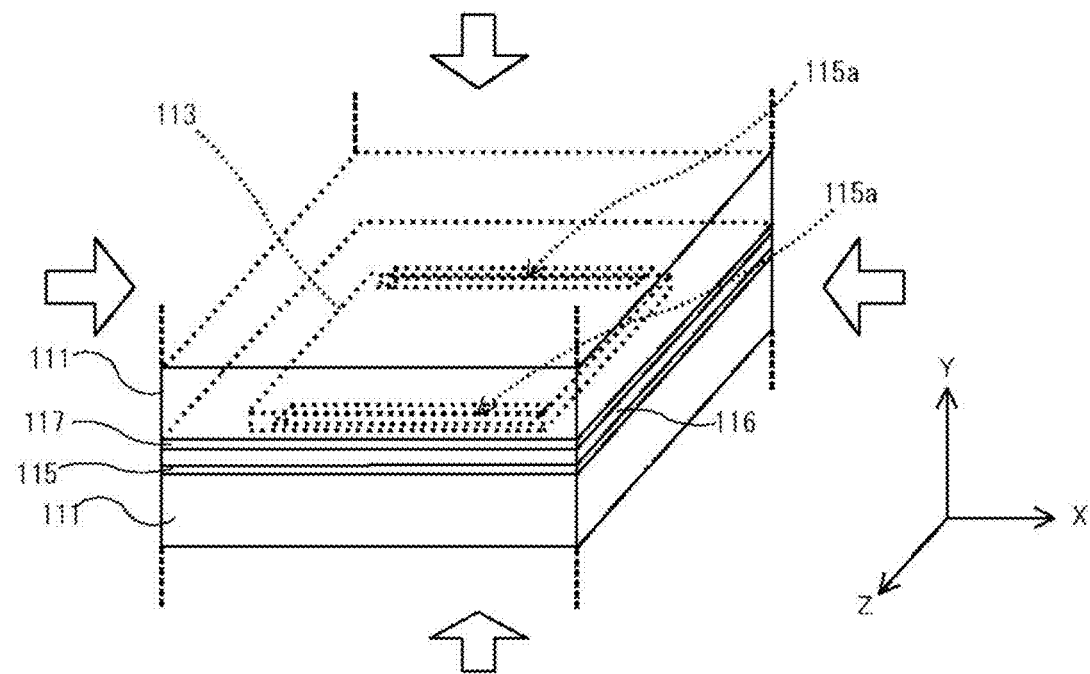

Thereafter, as indicated by arrows in FIG. 7C, through the use of an isostatic press method, the N-type oxide semiconductor material sheets 111 with the P-type semiconductor material paste layers 113 and the insulator paste layers 115, 116, and 117 are subjected to pressure bonding to form a laminated body. This laminated body includes the N-type oxide semiconductor material sheet 111, the P-type semiconductor material paste layer 113, the first insulator paste layer 115, the second insulator paste layer 116, and the third insulator paste layer 117. Next, with the use of a dicing saw, the laminated body produced is cut into an individual piece corresponding to one thermoelectric conversion element 10. The individual piece of the laminated body is formed in a rectangular parallelepiped shape of 4 mm×3.2 mm×3.2 mm, for example.

Thereafter, the individual piece of the laminated body is subjected to a degreasing treatment in the air, and then, the individual piece of the laminated body is subjected to firing under a condition at a temperature of 1200° C. to 1400° C. in a reducing atmosphere with an oxygen partial pressure of 10-10 to 10-15 MPa. As a firing method, a hot press sintering method, a sintering method of SPS (Spark Plasma Sintering), a sintering method of HIP (hot isostatic pressing), or the like may be adopted. In addition, the oxygen partial pressure may be any other oxygen partial pressure, as long as Ni is not oxidized, and as long as the thermoelectric characteristics of the first thermoelectric conversion parts 13 is not significantly degraded. Furthermore, the temperature for the firing may be any other temperature, as long as the relative density of the main constituents of the second thermoelectric conversion parts 11, the first thermoelectric conversion parts 13, and the insulator layer 15 is 80% or higher, and as long as the N-type oxide semiconductor material sheets 111, the P-type semiconductor material paste layers 113, and the insulator paste layers 115, 116, and 117 are co-sintered at the temperature.

In this regard, as described previously, the average particle size of the powder material of ZrO2 included in the insulator paste is set so that the time until completing the sintered insulator paste is longer than the time until completing the sintered N-type oxide semiconductor material sheets 111. Thus, as shown in FIG. 2, the outer surface of the first insulator part 15b has a shape recessed toward the inside of the thermoelectric conversion element 10 from the outer surface of the first thermoelectric conversion part 13.

Finally, a contact layer that has a laminated structure of an Ni layer and an Sn layer is formed by an electrolytic plating method on the base layer formed from Ni, and regarded as the electrode 16. Thus, the thermoelectric conversion element 10 is completed.

As just described, the method for manufacturing the thermoelectric conversion element 10 according to the first preferred embodiment can achieve simplification of the manufacturing process, because the number of firing times can be once.

Further, the thermoelectric conversion element 9010 according to Comparative Example 1 is fabricated by the following manufacturing method. A powder material of (Sr0.965La0.035)TiO3, an Ni powder material, an Mo powder material, an organic solvent, and a binder material are mixed to produce a mixture containing Ni, Mo, and (Sr0.965La0.035)TiO3. Then, the produced mixture is molded into a sheet to produce a P-type semiconductor material sheet as a base for the second thermoelectric conversion part 9011. Next, an insulator paste is applied to an N-type oxide semiconductor material sheet and the P-type semiconductor material sheet through the use of a printing technique. Subsequently, the N-type oxide semiconductor material sheet and P-type semiconductor material sheet with the insulator paste applied thereto are stacked alternately, before applying the Ni paste as a base for the electrode 16 and the insulator paste as a base for the electrode protection member 17, and subjected to pressure bonding to produce a laminated body. Thereafter, this laminated body is cut into individual pieces, and then subjected to firing.

Figure 8:
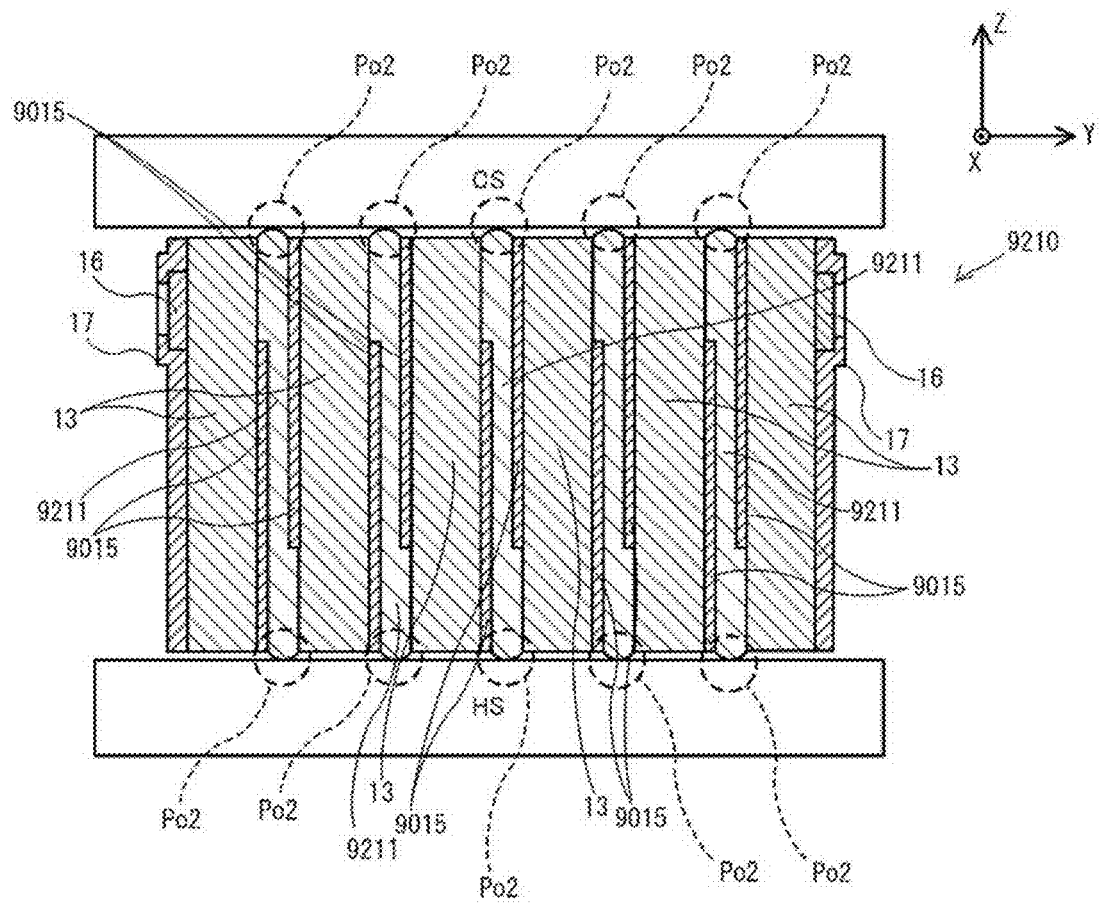
FIG. 8 is a cross-sectional view of a thermoelectric conversion element according to Comparative Example 3.

In the fired state, a peripheral edge of a second thermoelectric conversion part 9211 may be protruded from the outer surface of a thermoelectric conversion element 9210, for example, like the thermoelectric conversion element 9210 according to Comparative Example 3 as shown in FIG. 8. In this case, the protruded part (see the part Po2 surrounded by a dashed line in FIG. 8) of the second thermoelectric conversion part 9211 is brought into contact with the heat source HS and the cold source CS, but the area of contact is relatively small, thereby lowering the heat transfer efficiency from the heat source HS to the end of the thermoelectric conversion element 9210 in the −Z direction and the heat transfer efficiency from the end of the thermoelectric conversion element 9210 in the +Z direction to the cold source CS. Then, the temperature difference between the both ends of the thermoelectric conversion element 9210 in the Z axis direction becomes smaller than the temperature difference between the heat source HS and the cold source CS, and accordingly, the output voltage of the thermoelectric conversion element 9210 is decreased by that amount.

Therefore, in accordance with the method for manufacturing the thermoelectric conversion element 9010 according to Comparative Example 1, a polishing step is performed for polishing so that both ends of the thermoelectric conversion element 9210 in the Z axis direction become flat after firing. For 12 thermoelectric conversion elements 9010 for evaluation according to Comparative Example 1 as described previously, the output voltage was measured before polishing both ends of the elements in the Z axis direction. The output voltages were measured by keeping the temperature of the heat source in contact with the lower sides of the thermoelectric conversion elements 10, 9010 at 30° C. and keeping the temperature of the cold source in contact with the upper sides of the thermoelectric conversion elements 10, 9010 at 20° C. The average value for the output voltages obtained by the measurement was 35 mV, which was about half the average value 66 mV for the output voltages of the polished thermoelectric conversion elements 9010 described previously. From the foregoing, it is determined that the polishing step described previously is indispensable for the method for manufacturing the thermoelectric conversion element 9010 according to Comparative Example 1.

In contrast, in accordance with the method for manufacturing the thermoelectric conversion element 10 according to the first preferred embodiment, as described previously, the average particle size of the powder material of ZrO2 included in the insulator paste is adjusted, such that the outer surface of the first insulator part 15b have a shape recessed toward the inside of the thermoelectric conversion element 10 from the outer surface of the first thermoelectric conversion part 13 as shown in FIG. 2. Thus, the end surfaces 13c, 13d of the first thermoelectric conversion part 13 make surface contact with the heat source HS and the cold source CS. In this case, the area of contact of the first thermoelectric conversion part 13 is larger as compared with the area of contact of the thermoelectric conversion element 9010, thereby relatively increasing the heat transfer efficiency from the heat source HS to the end of the thermoelectric conversion element 10 in the −Z direction and the heat transfer efficiency from the end of the thermoelectric conversion element 10 in the +Z direction to the cold source CS. As described previously, also from the average value of 63 mV for the output voltages of the twelve thermoelectric conversion elements 10 according to the first preferred embodiment, which is comparable to the average value 66 mV for the output voltage of the thermoelectric conversion element 9010, it is determined that the heat transfer efficiencies between the thermoelectric conversion element 10 and the heat source HS and the cooling source CS are relatively increased. Therefore, the method for manufacturing the thermoelectric conversion element 10 eliminates the need for the previously described polishing step, which is indispensable for the method for manufacturing the thermoelectric conversion element 9010, thus making it possible to achieve simplification of the manufacturing method accordingly.

Modified Example

Figure 9A:
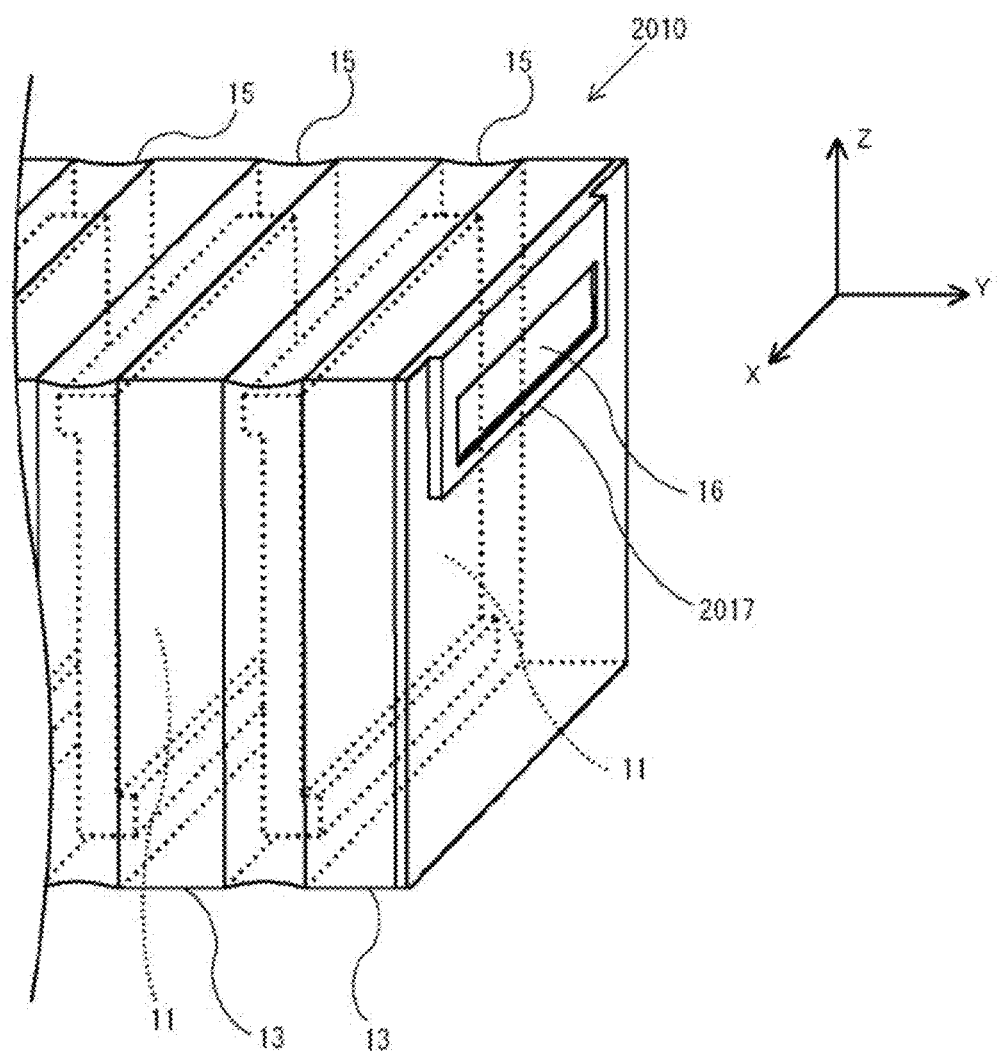
FIG. 9A is a partial perspective view of a thermoelectric conversion element according to a first modified example of the present invention.
Figure 9B:
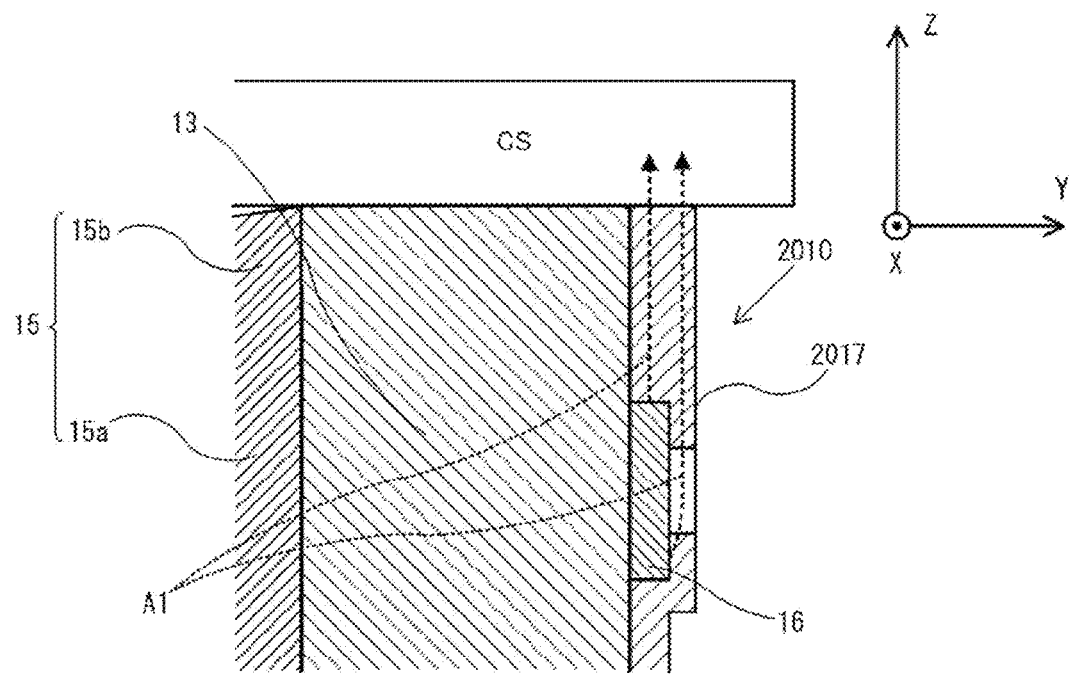
FIG. 9B is a partial cross-sectional view of the thermoelectric conversion element according to the modified example of FIG. 9A.

While the first preferred embodiment of the present invention has been described above, the present invention is not limited thereto. For example, as with a thermoelectric conversion element 2010 shown in FIG. 9A, one or both of the electrode protection members 2017 may be formed so as to increase the thickness of an end thereof in the +Z direction. It is to be noted that in FIG. 9A and FIG. 9B, the same constituent elements as in the embodiment are denoted by the same reference numerals as in FIG. 1 and FIG. 2. In this thermoelectric conversion element 2010, heat at the peripheral edge of the electrode 16 is transferred through the electrode protection member 2017 to the cold source CS, as indicated by dashed arrows A1 in FIG. 9B. Thus, temperature fluctuation is reduced at the peripheral edge of the electrode 16.

This configuration reduces the temperature fluctuation at the peripheral edge of the electrode(s) 16, thus making it possible to reduce the stress generated at the joint part between the electrode(s) 16 and a first thermoelectric conversion part 13 due to the temperature fluctuation at the peripheral edge of the electrode(s) 16. Therefore, the electrode(s) 16 and the electrode protection member(s) 2017 can be kept from being peeled from the associated first thermoelectric conversion part 13.

In accordance with the embodiment, the size of the electrode protection member 17 shown in FIG. 2 is not to be considered particularly limited, as long as the member covers the peripheral edge of the electrode 16.

Figure 10:
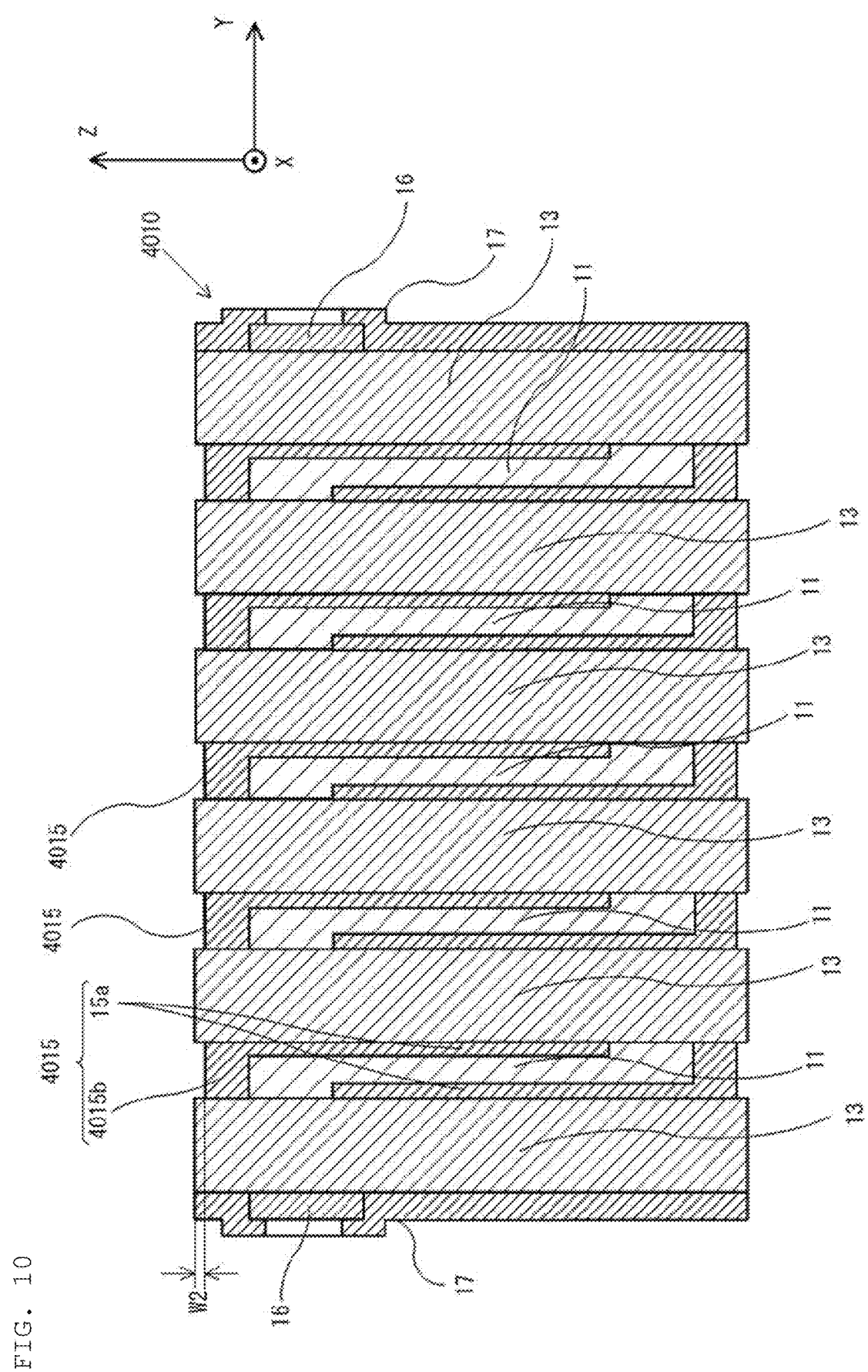
FIG. 10 is a cross-sectional view of a thermoelectric conversion element according to a second modified example.

In addition, as shown in FIG. 10, a thermoelectric conversion element 4010 may be adopted where the first insulator portions 4015b do not cover a part of the side surfaces (surfaces in the Y axis direction) of the first thermoelectric conversion portions 13. More specifically, the thermoelectric conversion element 4010 may be adopted where the side surfaces of the first thermoelectric conversion sections 13 are exposed. It is to be noted that in FIG. 10, the same constituent elements as in Embodiment 1 are denoted by the same reference numerals as in FIG. 2. The width W2 between the end surface of the first thermoelectric conversion parts 13 in the Z axis direction and the end surfaces of the first insulator parts 4015b in the Z axis direction can be set to be about 10 µm, for example.

This configuration can, for example, when the heat source HS and the cold source CS are formed from elastic materials, increase the area of contact with the heat source HS and the cold source CS, depending on the presence of the end of the first thermoelectric conversion parts 13 in the ±Z direction, with the end exposed without being covered with the first insulator part 4015b. Thus, the heat transfer efficiencies between the thermoelectric conversion element 10 and the heat source HS and the cold source CS are increased, thereby making it possible to bring the temperature difference between both ends of the thermoelectric conversion element 10 in the Z axis direction close to the temperature difference between the heat source HS and the coolant CS.

In the first preferred embodiment, an example of the thermoelectric conversion element 10 including electrode protection members 17 covering the entire peripheral edge of the electrodes 16 has been described, but the electrode protection members are not to be considered necessarily limited to any member covering the entire peripheral edge of the electrode 16. For example, like a thermoelectric conversion element 5010 shown in FIGS. 11 and 12, the lower end edge (the end edge on the −Z direction side) of the peripheral edge of an electrodes 5016 may be configured not to be covered with respective electrode protection members 5017. It is to be noted that in FIG. 11 and FIG. 12, the same constituent elements as in the embodiment are denoted by the same reference numerals as in FIG. 2.

Figure 11:
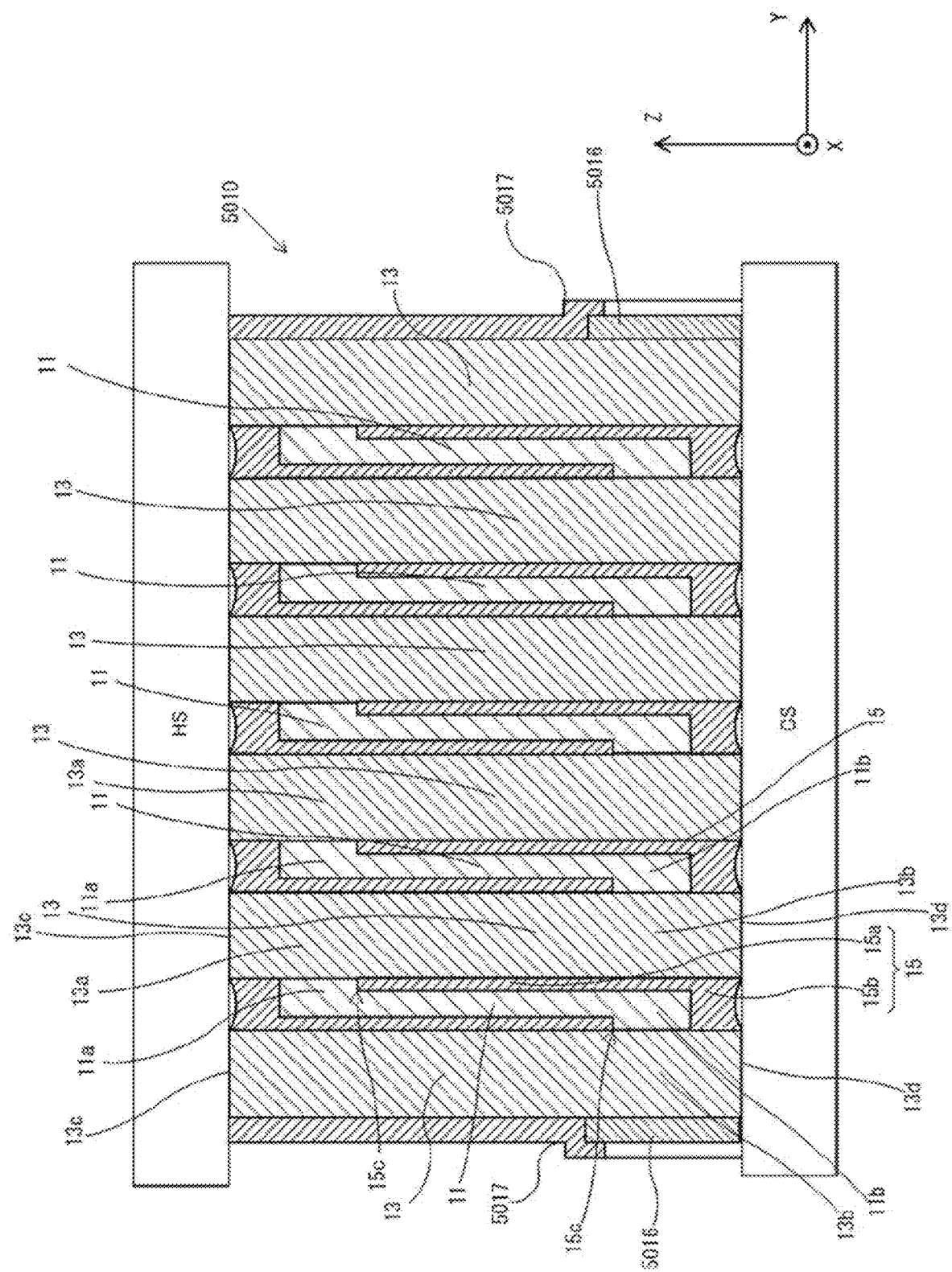
FIG. 11 is a cross-sectional view of a thermoelectric conversion element according to a third modified example.
Figure 12:
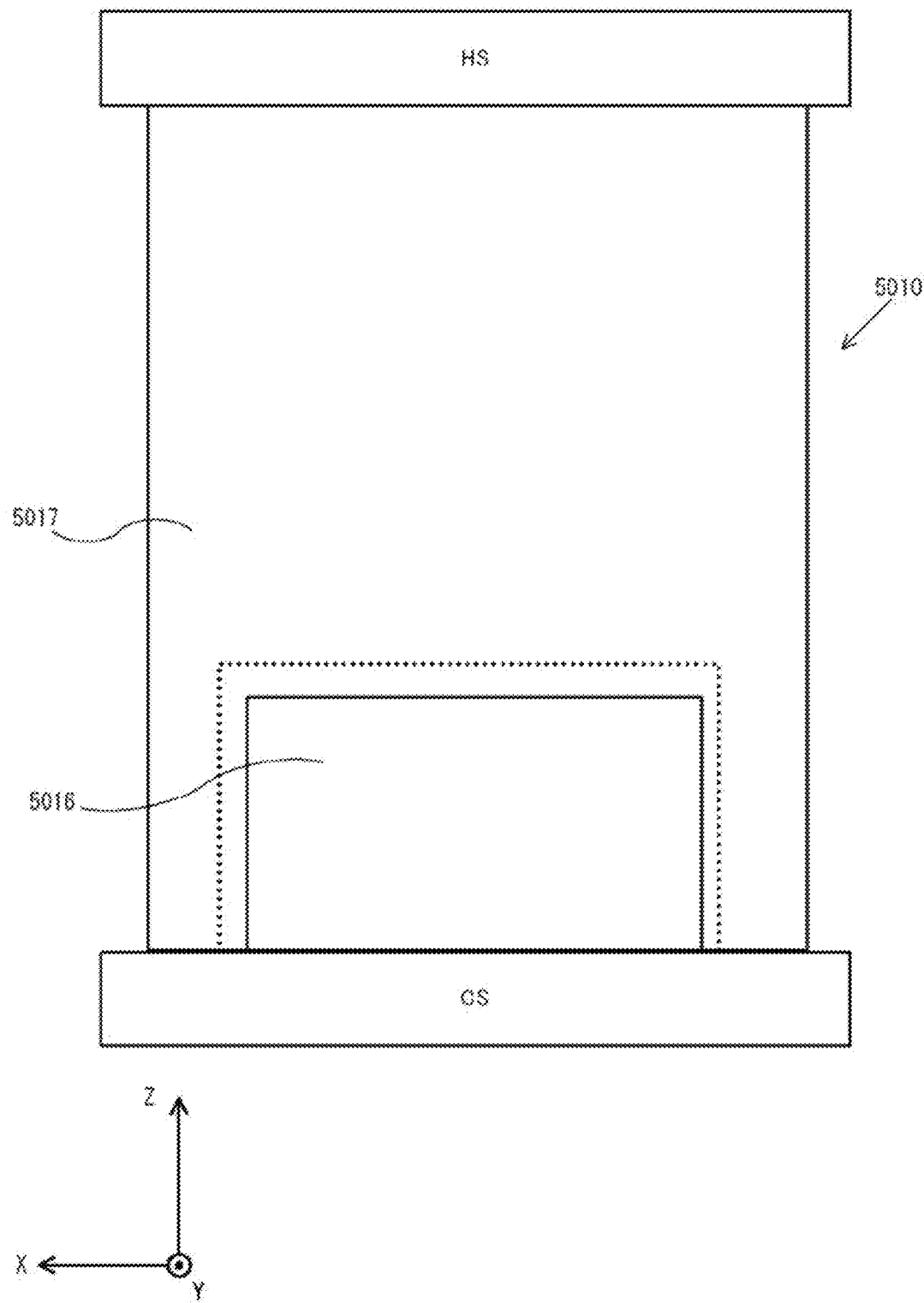
FIG. 12 is a side view in the case of viewing the thermoelectric conversion element according to the third modified example from a +Y direction.

The lower ends of the electrodes 5016 are exposed at the lower end surface (the end surface on the −Z direction side) of the thermoelectric conversion element 5010. Thus, with the electrode 5016 in contact with, for example, the cold source CS, the heat generated in the electrode 5016 or the electrode 5016 is efficiently transferred to the cold source CS. Therefore, when the thermoelectric conversion element 5010 is used in an environment with large changes in temperature, such as, for example, a heat cycle test environment, the temperature change in the electrodes 5016 is reduced, thus suppressing the degradation of the electrodes 5016, caused by thermal stress applied to the electrodes 5016. In addition, in the case of mounting the thermoelectric conversion element 5010 on a substrate with a conductive pattern formed thereon, the electrodes 5016 and the conductive pattern can be connected with a conductive member such as a solder or a silver paste, with the lower end of the electrodes 5016 in contact with the conductive pattern. It is to be noted that FIGS. 11 and 12 show therein an example of the end of the electrodes 5016 in contact with the cold source CS, but the present invention is not limited to this example, and for example, the end of the electrodes 5016 may be configured in contact with the heat source HS. Even in this case, with the electrodes 5016 in contact with the heat source HS, the temperature change in the electrodes 5016 is reduced. Therefore, degradation of the electrodes 5016 which is caused by thermal stress applied to the electrodes 5016 is suppressed.

In accordance with the method for manufacturing the thermoelectric conversion element 10 according to the embodiment, an example of using oxides ($La_2O_3$, $TiO_2$) and a carbonate ($SrCO_3$) has been described for producing the N-type oxide semiconductor material sheet and the P-type semiconductor material paste. However, the present invention is not limited to the example, and any other compound may be adopted as long as an oxide thermoelectric conversion material can be formed by firing. In addition, in accordance with the method for manufacturing the thermoelectric conversion element 10 according to the embodiment, an example of using Ni and Mo as raw materials for the metal of the P-type semiconductor material paste has been described, but the present invention is not limited to this example, and instead of Mo, Cr (chromium) or W (tungsten) may be used.

In accordance with the method for manufacturing the thermoelectric conversion element 10 according to the embodiment, an example of using a powder material of $ZrO_2$ with $Y_2O_3$ added thereto as a stabilizer(yttria-stabilized zirconia) has been described for the producing the insulator paste. However, the present invention is not limited to this example, and other types of oxides may be used as long as it is possible to make the oxides sintered together with the N-type oxide semiconductor material and the P-type semiconductor material, and as long as when the insulator paste is baked in a reducing atmosphere to form an insulator layer, the insulator layer has an electrical insulation property. In addition, the stabilizer is not limited to $Y_2O_3$, but may be other stabilizers (e.g., Ca, Mg, etc.). However, in view of the materials used for the N-type oxide semiconductor material sheet and the P-type semiconductor material paste, and the thermal expansion coefficient thereof, it is preferable to use $Y_2O_3$ or Ca as a stabilizer.

In accordance with the method for manufacturing the thermoelectric conversion element 10 according to the embodiment, an example has been described, where the thickness of the N-type oxide semiconductor material sheet is adapted to be 200 µm, the thickness of the P-type semiconductor material paste layer is adapted to be 50 µm, the thickness of the insulator paste layer is adapted to be 5 µm, and the number of N-type oxide semiconductor material sheets stacked is adapted to be 51. However, the thickness of the N-type oxide semiconductor material sheet, the thickness of the P-type semiconductor material paste layer, the thickness of the insulator paste layer, and the number of N-type oxide semiconductor material sheets laminated are examples and the invention is not limited to these examples. The foregoing thicknesses and number may be changed appropriately depending on the output voltage and output current required for the thermoelectric conversion element 10, the resistance value of a load connected to the thermoelectric conversion element 10, and the like.

In the first preferred embodiment, an example forming the electrode 16 by firing Ni paste has been described. However, the type of the conductive paste as a base for the electrode 16 is not to be considered limited to any Ni paste, as long as the material can be fired at the same time as the second thermoelectric conversion parts 11 and the first thermoelectric conversion parts 13. For example, a conductive paste containing NiMo, Pt, Pd, NiCr, or NiW may be adopted.

In accordance with the embodiment, an example of a so-called stacked-type thermoelectric conversion element 10 has been described where a plurality of film-shaped first thermoelectric conversion parts 13 and a plurality of film-shaped second thermoelectric conversion parts 11 are arranged alternately in the Y axis direction, but the structure of the thermoelectric conversion element is not limited to the stacked type. For example, a so-called π-type thermoelectric conversion may be adopted where column-shaped first thermoelectric conversion parts formed from an N-type oxide semiconductor material and column-shaped second thermoelectric conversion parts formed from a P-type semiconductor material are arranged alternately. In this case, an insulator part may be provided so as to cover the surfaces of the second thermoelectric conversion parts so that the surfaces of the second thermoelectric conversion parts are not exposed to the outside.

The embodiment and modified examples of the present invention (including the descriptions in the notes, the same applies hereinafter) have been described above, but the present invention is not to be considered limited to these. The present invention encompasses appropriate combinations of the embodiment and the modified examples, and the combinations to which modifications are made appropriately.

DESCRIPTION OF REFERENCE SYMBOLS 10, 2010, 4010, 5010: thermoelectric conversion element
11: second thermoelectric conversion part
11a, 11b, 13a, 13b: end
13: first thermoelectric conversion part
13c, 13d: end surface
15: insulator layer
15a: second insulator part
15b, 4015b: first insulator part
15c: through hole
15d: depressed part
115a: first slit
117a: second slit
16, 5016: electrode
17, 2017, 5017: electrode protection member
111: N-type oxide semiconductor material sheet
113: P-type semiconductor material paste layer
115: first insulator paste layer
116: second insulator paste layer
117: third insulator paste layer
HS: heat source
CS: cold source

The invention claimed is:

1. A thermoelectric conversion element comprising a laminated body having first and second opposing principal surfaces which are spaced from each other along a first direction and first and second opposing end surfaces which are spaced from each other along a second direction, the second direction being perpendicular to the first direction the laminated body comprising:
a plurality of first and second thermoelectric conversion parts which alternate with one another so as to define a plurality of thermoelectric conversion part pairs, each thermoelectric conversion part pair including a respective first thermoelectric conversion part and a respective second thermoelectric conversion part, a joint surface of the first thermoelectric part of the pair facing a joint surface of the second thermoelectric part of the pair;
a plurality of insulator layers, each insulator layer being associated with a respective thermoelectric conversion part pair, each insulator being located between a first portion of the facing joint surfaces of the first and second thermoelectric conversion parts of its respective thermoelectric conversion part pair, a second portion of the facing joint surfaces of the first and second thermoelectric conversion parts of each thermoelectric part pair being in direct contact with one another;
each first thermoelectric conversion part extending to both the first and second end surfaces; and
each second thermoelectric conversion part facing, but being spaced from, the first end surface by a respective one of the insulator parts.

2. The thermoelectric conversion element according to claim 1, wherein the laminated body has a central axis running parallel to the first direction, the thermoelectric conversion element further comprising first and second electrodes respectively provided on the first and second principal surfaces of the laminated body, the first and second electrodes each having a center that is offset from the central axis.

3. The thermoelectric conversion element according to claim 2, further comprising an electrode protection member covering a peripheral edge of the first electrode.

4. The thermoelectric conversion element according to claim 1, wherein each of the insulators has an end face that faces a respective one of the first and second end surface, the end face of each of the insulating layers being curved to form a depression whereby each end face has a respective depression facing one of the first and second end surfaces.

5. The thermoelectric conversion element according to claim 4, wherein, for each insulator, the distance from the deepest part of its respective depression to the first or second end surface of the laminated body that it opposes is 10 µm.

6. The thermoelectric conversion element according to claim 1, wherein:
the first thermoelectric conversion part is an oxide semiconductor;
the second thermoelectric conversion part is a semiconductor comprising a metal; and
the insulator layer is an oxide insulator.

7. The thermoelectric conversion element according to claim 6, wherein:
the oxide semiconductor is an N-type semiconductor comprising a composite oxide;

the semiconductor comprising the metal is a P-type semiconductor comprising Ni, Mo, and the composite oxide;

the oxide insulator comprises ZrO2; and the composite oxide comprises at least one of Sr, La, and Ti.

8. The thermoelectric conversion element according to claim 1, wherein the portion of the respective one of the insulator layers covers the entire end face of its associated second thermoelectric conversion part.

9. The thermoelectric conversion element according to claim 1, further comprising first and second electrode protection members covering respective peripheral edges of the first and second electrodes.

10. The thermoelectric conversion element according to claim 1, wherein each second thermoelectric conversion part facing, but being spaced from, the second end surface by a respective one of the insulator parts.

11. The thermoelectric conversion element according to claim 1, wherein each of the insulator parts are L-shaped, with one leg of the L-shape being located between the first portion of the facing joint surface of its respective thermoelectric part pair and the other leg of the L-shape being located between an end of the second thermoelectric conversion part of its respective thermoelectric part pair and either the first or second end surface.

12. The thermoelectric conversion element of claim 1, wherein:

the first principal surface is a planar surface;

each of the first thermoelectric conversion part extends to the first principal surface; and each of the insulator parts which is separates a second thermoelectric conversion part and the first end surface does not extend beyond the first end surface.

13. A combination including:

the thermoelectric conversing element of claim 1;

a cold source abutting the first end surface; and a hot source abutting the second end surface.

* * * * *